(12) United States Patent
Hashimoto et al.

(10) Patent No.: US 9,049,389 B2
(45) Date of Patent: Jun. 2, 2015

(54) IMAGING APPARATUS AND IMAGING SYSTEM

(71) Applicant: CANON KABUSHIKI KAISHA, Tokyo (JP)

(72) Inventors: Seiji Hashimoto, Yokohama (JP); Yasushi Matsuno, Fujisawa (JP); Takeru Suzuki, Kawasaki (JP); Kazuyuki Shigeta, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 161 days.

(21) Appl. No.: 13/782,706

(22) Filed: Mar. 1, 2013

(65) Prior Publication Data

US 2013/0271633 A1  Oct. 17, 2013

(30) Foreign Application Priority Data

Apr. 12, 2012  (JP) .................................. 2012-091123
Dec. 28, 2012  (JP) .................................. 2012-288391

(51) Int. Cl.
 H04N 5/217 (2011.01)
 H04N 5/20 (2006.01)
 H04N 5/235 (2006.01)
 H04N 5/335 (2011.01)
 H04N 5/353 (2011.01)
 H04N 5/355 (2011.01)
 H04N 5/357 (2011.01)
 H04N 5/378 (2011.01)

(52) U.S. Cl.
 CPC ............... *H04N 5/353* (2013.01); *H04N 5/355* (2013.01); *H04N 5/357* (2013.01); *H04N 5/378* (2013.01)

(58) Field of Classification Search
None
See application file for complete search history.

(56) References Cited

U.S. PATENT DOCUMENTS

| 4,731,665 | A | 3/1988 | Hashimoto et al. ...... 358/213.27 |
| 4,751,559 | A | 6/1988 | Sugawa et al. .................. 357/30 |
| 4,847,668 | A | 7/1989 | Sugawa et al. .................. 357/30 |
| 4,959,723 | A | 9/1990 | Hashimoto ............... 358/213.11 |
| 4,962,412 | A | 10/1990 | Shinohara et al. .............. 357/30 |
| 5,146,339 | A | 9/1992 | Shinohara et al. ............ 358/212 |
| 5,283,428 | A | 2/1994 | Morishita et al. .......... 250/214.1 |
| 7,019,373 | B2 | 3/2006 | Hashimoto .................... 257/432 |
| 7,592,645 | B2 | 9/2009 | Hashimoto .................... 257/184 |
| 7,732,884 | B2 | 6/2010 | Hashimoto .................... 257/432 |
| 7,859,575 | B2 | 12/2010 | Ota et al. .................... 348/222.1 |
| 7,884,434 | B2 | 2/2011 | Hashimoto .................... 257/432 |

(Continued)

FOREIGN PATENT DOCUMENTS

JP  2008-124842 A  5/2008

*Primary Examiner* — Lin Ye
*Assistant Examiner* — Euel Cowan
(74) *Attorney, Agent, or Firm* — Fitzpatrick, Cella, Harper & Scinto

(57) ABSTRACT

An AD converting unit compares an output signal from an amplifier circuit after reset of a pixel with a reference signal of time-variable, outputs a first digital value, when the output signal from the amplifier circuit in a non-reset state of the pixel is larger than a threshold, sets a gain of the amplifier circuit to a first gain, when the output signal is smaller than the threshold, sets the gain of the amplifier circuit to a second gain larger than the first gain, further after the gain of the amplifier circuit was set to the first or second gain, compares the output signal from the amplifier circuit in the non-reset state of the pixel with the reference signal of time-variable, and outputs a second digital value. When resolutions of the first and second digital values differ, a correcting unit corrects a difference between the resolutions.

19 Claims, 15 Drawing Sheets

(56) References Cited

U.S. PATENT DOCUMENTS

| | | | |
|---|---|---|---|
| 7,969,484 B2 | 6/2011 | Egawa | 348/229.1 |
| 8,189,086 B2 | 5/2012 | Hashimoto et al. | 348/300 |
| 8,310,576 B2 | 11/2012 | Hashimoto et al. | 348/300 |
| 8,390,710 B2 | 3/2013 | Shigeta et al. | 348/296 |
| 2008/0218619 A1* | 9/2008 | Egawa | 348/296 |
| 2009/0225211 A1* | 9/2009 | Oike | 348/308 |
| 2009/0244334 A1* | 10/2009 | Otaka | 348/294 |
| 2010/0157083 A1 | 6/2010 | Ohya et al. | 348/222.1 |
| 2012/0098990 A1* | 4/2012 | Jung et al. | 348/222.1 |
| 2012/0212637 A1 | 8/2012 | Tsuduki et al. | 348/222.1 |
| 2012/0327279 A1 | 12/2012 | Hashimoto et al. | 348/300 |
| 2013/0162874 A1 | 6/2013 | Hashimoto et al. | 348/300 |
| 2013/0206961 A1 | 8/2013 | Ikeda et al. | 250/208.1 |

\* cited by examiner

AD DATA IMAGE OF LOW GAIN SIGNAL

AD DATA IMAGE OF HIGH GAIN SIGNAL

AD DATA IMAGE OF LOW GAIN SIGNAL

AD DATA IMAGE OF HIGH GAIN SIGNAL

FIG. 13

| IMAGING SENSITIVITY (ISO) | AMPLIFIER GAIN | | RAMP (INCLINATION RATIO) | DR | NOISE AFTER CORRECTING HIGH GAIN SIGNAL | |
|---|---|---|---|---|---|---|
| | LOW | HIGH | | | CIRCUIT SERIES NOISE | PHOTON SHOT NOISE |
| 100 | 1 | 8 | 1 | 8 | 1/8 | |
| 200 | 1 | 8 | 1 | 4 | 1/4 | |
| 400 | 1 | 8 | 1 | 2 | 1/2 | |
| 800 | 2 | 16 | 1 | 1 | 1/2 | LARGE |
| 1600 | 2 | 16 | 1/2 | 1/4 | | LARGE |
| 3200 | 2 | 16 | 1/4 | 1/8 | | LARGE |
| 6400 | 4 | 16 | 1/4 | 1/16 | | LARGE |
| 12800 | 4 | 16 | 1/8 | 1/32 | | LARGE |

IMAGING APPARATUS AND IMAGING SYSTEM

BACKGROUND OF THE INVENTION

1. Field of the Invention

The present invention relates to an imaging apparatus and an imaging system.

2. Description of the Related Art

A technique is known that in an image sensor device, different gain processes are performed on a pixel signal and the pixel signal is AD (analog-to-digital) converted. With this technique, the converted signal is read out from a memory, and its gain is corrected thereafter, and the resultant AD data is selected based on a signal level, thereby widening a dynamic range. Such technique is disclosed in the Official Gazette of Japanese Patent Application Laid-Open No. 2008-124842.

According to the current on-chip AD converting technique, generally, AD data of a reset noise of a comparator is subtracted from AD data of a pixel signal having the same resolution.

The AD data of the reset noise has a problem on an AD conversion precision that is caused by the reset noise of the comparator. According to the Official Gazette of Japanese Patent Application Laid-Open No. 2008-124842, nothing is disclosed about a correction of the reset noise of a different gain signal in an AD converter.

SUMMARY OF THE INVENTION

According to an aspect of the present invention, an imaging apparatus comprises: a pixel configured to generate a signal by photoelectric conversion; an amplifier circuit configured to amplify the signal from the pixel at a set gain; an AD converting unit; and a correcting unit, wherein the AD converting unit compares an output signal from the amplifier circuit after reset of the pixel with a reference signal which changes with time, to output a first digital value, sets the gain of the amplifier circuit at a first gain when the output signal from the amplifier circuit at a non-reset state of the pixel is larger than a threshold, sets the gain of the amplifier circuit at a second gain larger than the first gain when the output signal from the amplifier circuit at the non-reset state of the pixel is smaller than the threshold, and, after setting the gain of the amplifier circuit at the first or second gain, compares the output signal from the amplifier circuit at the non-reset state of the pixel with the reference signal which changes with time, to output a second digital value, and, when a resolution of the first digital value is different from a resolution of the second digital value, the correcting unit corrects the difference of the resolutions.

Further features of the present invention will become apparent from the following description of exemplary embodiments with reference to the attached drawings.

BRIEF DESCRIPTION OF THE DRAWINGS

FIG. 13 is an explanatory diagram of an amplifier gain and a ramp signal at the time of imaging.

DESCRIPTION OF THE EMBODIMENTS (First Embodiment)

Figure 1:
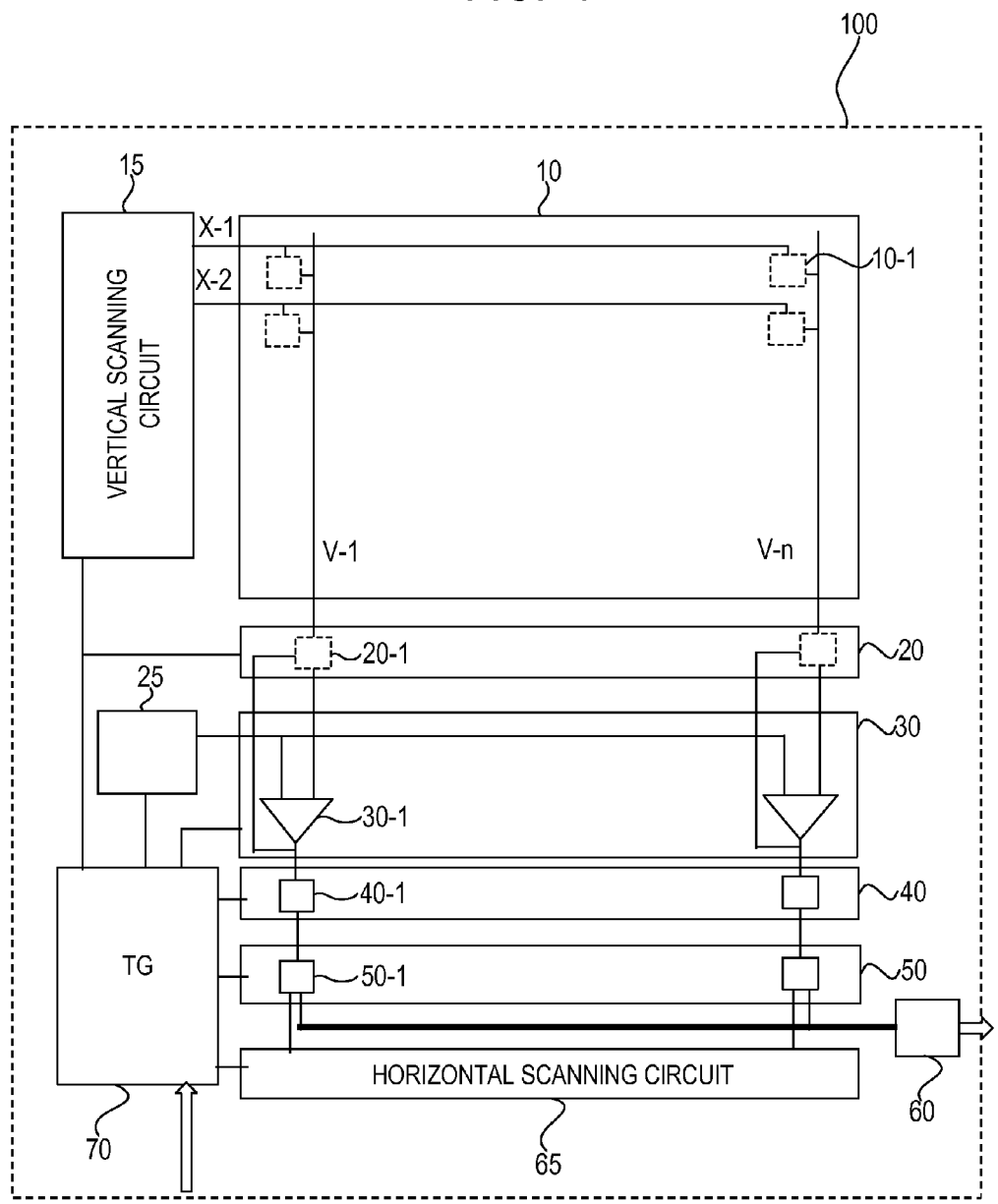
FIG. 1 is a constructional diagram of an imaging device according to the first embodiment of the invention.

FIG. 1 is a schematic constructional diagram of an imaging device 100 according to the first embodiment of the invention. The imaging device 100 is a device called "CMOS image sensor" and photoelectrically converts a photo-sensed object image and outputs an obtained electric signal as a digital signal. The imaging device 100 has a pixel unit 10, a vertical scanning circuit 15, an amplifying unit 20, a ramp signal generating circuit (reference signal generating circuit) 25, a comparing unit 30, a counter unit 40, a memory unit 50, an output circuit 60, a horizontal scanning circuit 65, and a timing generating circuit (TG) 70. The pixel unit 10 has a plurality of pixels 10-1 arranged in a two-dimensional matrix form. The pixel 10-1 outputs a pixel signal by a photoelectric conversion. The vertical scanning circuit 15 outputs driving pulses X-1, X-2, . . . to the pixel unit 10. The amplifying unit 20 amplifies the pixel signal from the pixel unit 10 at a preset gain. As a comparison signal with the pixel signal, the ramp signal generating circuit 25 generates a ramp signal (reference signal) of time-variable (that is, which changes with the elapse of time). The comparing unit 30 compares the pixel signal amplified by the amplifying unit 20 with the ramp signal. The counter unit 40 counts until the comparing unit 30 outputs a comparison result. The memory unit 50 holds count data from the counter unit 40. The horizontal scanning circuit 65 transfers the data from the memory unit 50 to the output circuit 60. The timing generating circuit 70 controls timing of each of the foregoing circuit blocks.

In the pixel unit 10, the plurality of pixels 10-1 are arranged on an area and its constructional example will be described hereinafter with reference to FIG. 2. Rows of the respective pixels 10-1 are sequentially driven by the driving pulses X-1 and X-2 from the vertical scanning circuit 15. Signals which were output from the respective pixels 10-1 are guided to the amplifying unit 20 through vertical signal lines V-1 to V-n. Each circuit is provided for the amplifying unit 20 to the memory unit 50 every vertical signal lines V-1 to V-n. Each circuit may be provided in the vertical direction of the vertical signal lines V-1 to V-n. For example, each circuit may be provided for the pixels of the even-number designated columns in such a manner that the signals are transmitted downwardly in the pixel unit in the diagram and may be provided for the pixels of the odd-number designated columns in such a manner that the signals are transmitted upwardly in the pixel unit in the diagram. Each amplifier circuit 20-1 in the amplifying unit 20 may have only a function for merely amplifying the signal from the pixel 10-1 or may have a CDS processing function for executing a noise reduction processing by a correlated double sampling. The CDS processing may be executed in an input unit of the comparing unit 30.

The comparing unit 30 has a plurality of comparator circuits 30-1 corresponding to a plurality of pixel columns. First, the comparator circuit 30-1 compares an N-signal from the amplifier circuit 20-1 with the ramp signal from the ramp signal generating circuit 25. If the amplifier circuit 20-1 has the CDS function, the N-signal is a signal corresponding to a state where the amplifier circuit 20-1 has been reset. If the amplifier circuit 20-1 does not have the CDS function, the N-signal is a signal corresponding to a state where the pixel 10-1 has been reset. By a count setting in which a gain difference has been corrected, a counter circuit 40-1 of the counter unit downcounts until a magnitude relation between the N-signal and the ramp signal is reversed in the comparator circuit 30-1 from the start of the inclination ratio of the ramp signal. After that, the comparator circuit 30-1 compares the S-signal from the amplifier circuit 20-1 with the threshold from the ramp signal generating circuit 25. If the amplifier circuit 20-1 has the CDS function, the S-signal is a signal corresponding to a non-reset state of the amplifier, in other words, the amplifier outputs a signal input to the amplifier. If the amplifier circuit 20-1 does not have the CDS function, the S-signal is a signal based on the photoelectric conversion by the pixel 10-1. In accordance with a comparison result, the comparator circuit 30-1 decides or selects whether a gain of the amplifier circuit 20-1 of all pixel columns is a low gain or a high gain and compares the S-signal at such a gain with the ramp signal. The counter circuit 40-1 has a function for correcting the gain difference. As a correcting method, there are a method of correcting the high gain for the low gain and a method of correcting the low gain for the high gain. The correcting method will be described in detail hereinafter. The former correcting method will be mainly described. When the gain of the amplifier circuit 20-1 is low, the upcounting is performed without correcting the gain difference. When the gain of the amplifier circuit 20-1 is high, the upcounting is performed in a state where the gain difference has been corrected. The counting in which the gain difference has been corrected denotes such an operation that an increase or decrease of a count value for a clock signal which is input to the counter circuit 40-1 is changed and the counting is performed. That is, when the gain difference from the gain at the time of the AD conversion of the N-signal is not corrected, a fluctuation width of the count value is equal to that at the time of the conversion of the N-signal. When the gain difference is corrected, the fluctuation width of the count value differs from that at the time of the conversion of the N-signal. A memory circuit 50-1 of the memory unit 50 holds the count value (digital data) of the counter circuit 40-1. The digital data held in the memory circuit 50-1 is transferred to the output circuit 60 by a scanning pulse from the horizontal scanning circuit 65. In the foregoing counter unit 40, the operation of a column counter system in which the counting is performed by an up/down counter provided every column has been described. However, in a common counter system in which a common counter is used by the plurality of comparator circuits 30-1, it is also possible to construct in such a manner that a counter signal is latched in accordance with the comparison result of the comparator circuit, the count data of the N-signal and the count data of the S-signal are individually stored into the memory, and the gain difference is corrected at the post stage. After that, a differential processing of the count data of the N-signal and the S-signal is executed.

As mentioned above, according to the imaging device 100, since the gain difference is corrected and the counting is performed at the time of comparison between the N-signal and the ramp signal, there is such an effect that a quantization error of the digital data is decreased. By using the counter circuit 40-1 having the function for correcting the gain difference and counting, there is such an effect that the memory circuit 50-1 can be simplified and a differential processing circuit can be reduced from the memory circuit 50-1. By the gain correcting function, the AD conversion processing of the small number of bits is executed, a bit rate is raised, and a high speed can be accomplished.

Figure 2:
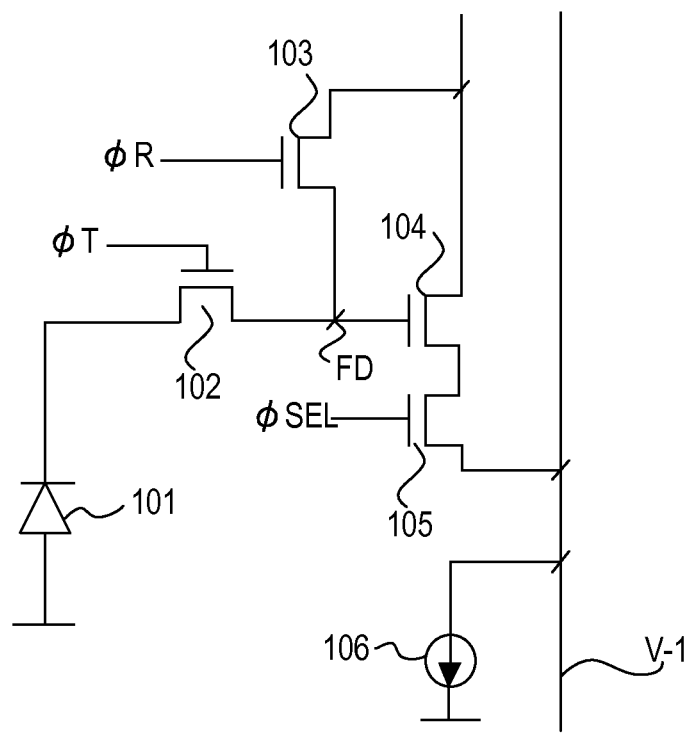
FIG. 2 is a diagram illustrating a constructional example of a pixel.

FIG. 2 is a circuit diagram illustrating a constructional example of the pixel 10-1. The pixel 10-1 has a photodiode 101, a transfer transistor 102, a reset transistor 103, an amplifying transistor 104, and a selection transistor 105. The photodiode 101 is a photoelectric conversion element for generating electric charges by a photoelectric conversion. The transfer transistor 102 transfers the electric charges accumulated in the photodiode 101 to a floating diffusion portion FD by a controlling pulse φT. The amplifying transistor 104 amplifies the electric charges in the floating diffusion portion FD by a source-follower read-out. The reset transistor 103 resets the electric charges in the floating diffusion portion FD by a power source potential in response to a controlling pulse φR. The selection transistor 105 outputs an output signal from the amplifying transistor 104 to the vertical signal line V-1 in response to a controlling pulse φSEL. A current source 106 is connected to the vertical signal line V-1. The pixel 10-1 is not limited to the constructional example of FIG. 2 but may have a construction in which the selection transistor 105 is eliminated and a selection control of the pixels is performed by an electric potential which is set into the floating diffusion portion FD, a construction in which the common amplifying transistor 104 is shared by a plurality of photoelectric conversion elements 101, or the like.

Figure 3A:
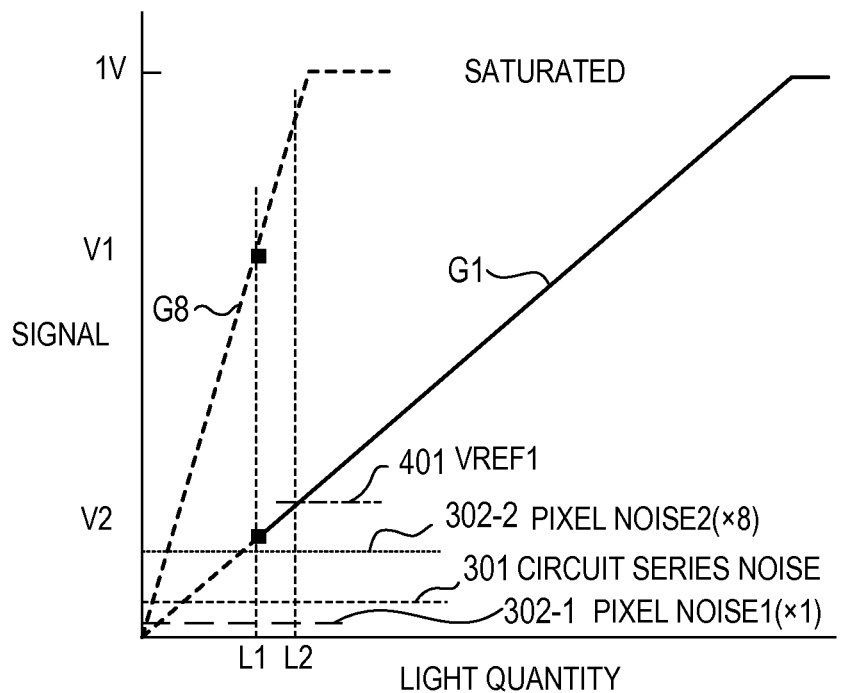
FIGS. 3A and 3B are explanatory diagrams about a comparing method of a noise contained in a pixel signal, a signal level, and a threshold voltage.
Figure 3B:
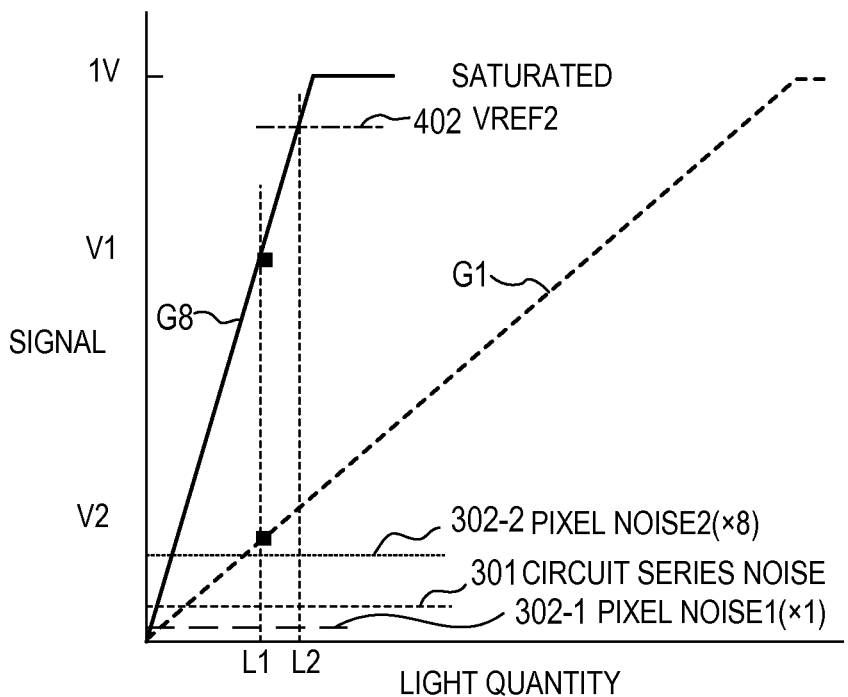

FIGS. 3A and 3B are explanatory diagrams about a comparing method of a noise contained in a pixel signal, its signal level, and a threshold voltage. In FIGS. 3A and 3B, an axis of abscissa indicates a quantity of incident light into the pixel 10-1 and an axis of ordinate indicates a level of the signal which is subjected to the AD conversion. G1 and G8 shown by solid lines in FIGS. 3A and 3B denote pixel signals in which gains of the amplifier circuits differ. A broken line 301 indicates a circuit series noise (noise that is caused by a power source, a ground, the amplifier circuit, the AD conversion, etc.). A broken line 302-1 indicates a pixel noise at an input of the amplifier circuit after the CDS (pixel noise<input conversion noise of the amplifier<circuit series noise). The circuit series noise 301 is larger than the pixel noise 302-1. Assuming that the circuit series noise 301 is equal to 0.2 mV, an S/N ratio serving as a ratio between the signal level of 1V and the pixel noise of 0.2 mV is equal to 74 dB. In order to perform the AD conversion while covering the S/N ratio, a resolution of about 14 bits is necessary in consideration of a quantization bit error. The higher the resolution is, the longer a counting period is. Therefore, an AD conversion time becomes long and a signal read-out speed as an imaging device 100 is low, so that the high-speed imaging cannot be performed.

Therefore, in the embodiment, the number of bits of the AD conversion is reduced, thereby accomplishing the high-speed read-out. When the pixel signal is large, since a photon shot noise is larger than the circuit series noise, an influence on the S/N ratio by the circuit series noise is small. Therefore, for example, the gain of the amplifier circuit 20-1 is set to 1 time (characteristics of G1). When the pixel signal is small, in the incident light–output characteristics of G1, since the circuit series noise is larger than the pixel noise, it becomes a dominant factor of the S/N ratio. Therefore, by setting the gain of the amplifier circuit 20-1 to 8 times (characteristics of G8), a pixel noise 302-2 is larger than the circuit series noise 301 and the pixel noise 302-2 becomes a dominant factor of the S/N ratio. By using the characteristics of G1, the signal in which a light quantity range until the output is saturated is wide can be obtained. By using the characteristics of G8, the signal of the S/N ratio higher than that in the case of the characteristics of G1 can be obtained. As mentioned above, one of the characteristics of G1 and the characteristics of G8 is selected in accordance with the incident light quantity, that is, the signal level. Thus, as for the signal which is obtained from the imaging apparatus, with respect to the pixel in which a small signal is output, a good S/N ratio is obtained, and with respect to the pixel in which a large signal is output, a wider dynamic range than that of the pixel in which a small signal is output can be obtained.

As a discriminating method of the signal level, there are a method using the characteristics of G1 and a method using the characteristics of G8. FIG. 3A illustrates a case where the signal level is discriminated by comparing the characteristics G1 shown by the solid line with a threshold voltage VREF1 shown by an alternate long and short dash line 401. FIG. 3B illustrates a case where the signal level is discriminated by comparing the characteristics G8 shown by the solid line with a threshold voltage VREF2 shown by an alternate long and short dash line 402.

In FIGS. 3A and 3B, a signal level corresponding to a light quantity L2 is set as a threshold voltage VREF1 or VREF2. When the gain signal is larger than the threshold voltage, the characteristics G1 is used. When the gain signal is smaller than the threshold voltage, the characteristics G8 is used.

It is desirable to set the threshold voltage VREF2 to such a value that there is a linearity in the characteristics of G8 and it is smaller than a saturated signal. It is desirable to set the threshold voltage VREF1 to a value obtained by dividing the threshold voltage VREF2 by a gain ratio between the characteristics of G8 and the characteristics of G1. However, there is no need to set the threshold voltage to a strict value. This is because since the large signal has a large photon shot noise, even if the signal in which the threshold voltage differs slightly was discriminated, the dominant factor of the S/N ratio does not change.

A case where the incident light quantity is equal to L1 will be described. When the incident light quantity is equal to L1, as shown in FIG. 3A, a case where the signal level is discriminated by using the signal of the characteristics of G1 and the threshold voltage VREF1 will now be considered. According to the characteristics of G1, the signal level in the case where the incident light quantity is equal to L1 is equal to V2 and is smaller than the threshold voltage VREF1. Therefore, the signal of the characteristics of G8 is selected. As shown in FIG. 3B, a case where the signal level is discriminated by using the signal of the characteristics of G8 and the threshold voltage VREF2 will now be considered. According to the characteristics of G8, the signal level in the case where the incident light quantity is equal to L1 is equal to V1 and is smaller than the threshold voltage VREF2. Therefore, the signal of the characteristics G8 is selected.

The pixel signal V1 of the characteristics G8 in which the signal obtained at the incident light quantity L1 has been amplified to 8 times is AD converted, the gain correction (return to an original signal amplitude) is performed after the conversion, and the digital data of the pixel signal V2 is obtained. Thus, the circuit series noise is reduced into 1/8 according to a calculation and there is such an effect that the high S/N ratio is obtained. The pixel signal level is not particularly limited to the level at the time of the light quantity L1 but a similar effect can be obtained even in a range where it is smaller than the threshold voltage of the light quantity L2.

By gain-correcting the gain difference, that is, by bit-shifting (bit correction: in the foregoing example, bits) the digital data of a precision of 13 bits can be ideally obtained by the 10 bit AD converter. However, when considering a case where the digital data of the N-signal is differential-processed from the digital data of the S-signal, in the case of the least significant bit of the digital data of the pixel signal G1 in which the gain is equal to 1 time, since the quantization error is increased by the differential processing of the S-signal and the N-signal, a precision of 10 bits is not obtained. In order to decrease the quantization error, the gain difference of the digital data of the N-signal is corrected, that is, the digital data of the N-signal is shifted by 3 bits, thereby decreasing the quantization error caused by the differential processing of the S-signal and the N-signal.

The method whereby when the pixel signal is small, the digital data of the pixel signal G8 amplified at the high gain of 8 times is corrected to the data of the original gain of 1 time, thereby eventually improving the S/N ratio as mentioned above has been described. The method whereby when the pixel signal is large, in order to preferentially widen the dynamic range of the pixel signal, the digital data of the characteristics G1 in which the large signal was amplified at the low gain of 1 time is set as upper bits for the digital data of the characteristics G8, and the bit shift of the gain difference is performed has been described.

Figure 4:
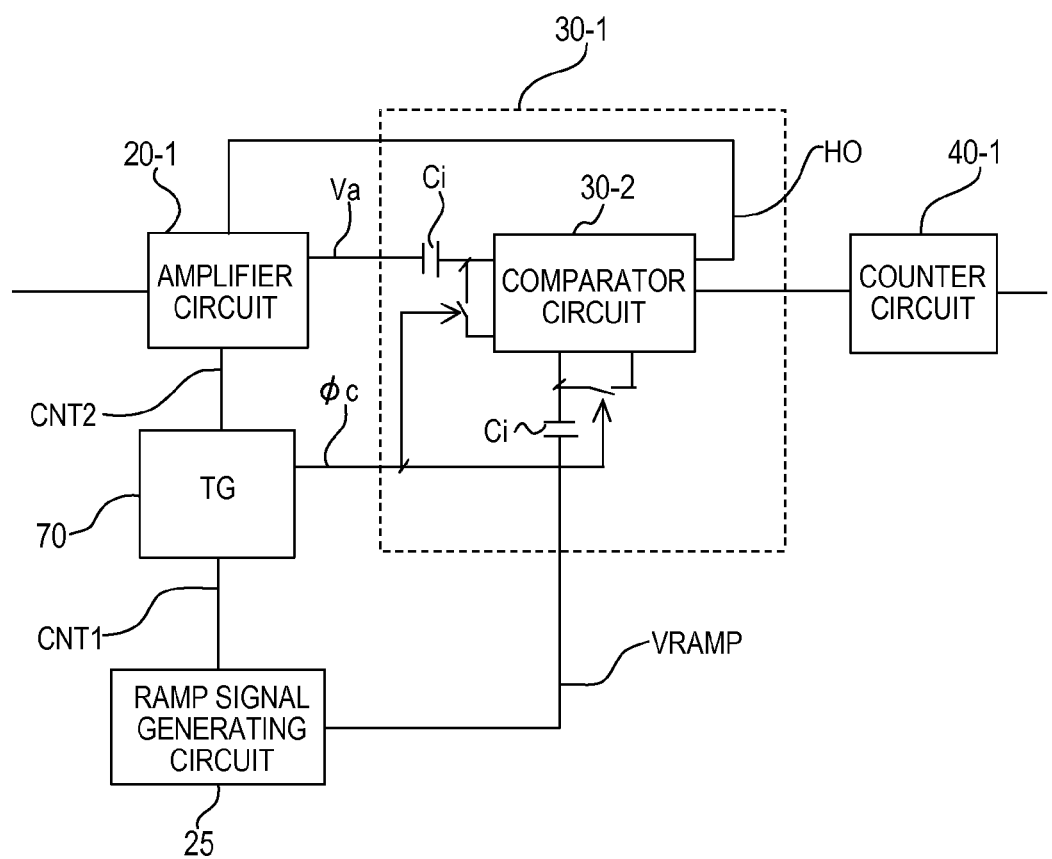
FIG. 4 is a block diagram of an AD converting unit.

FIG. 4 is a block diagram of an AD converting unit for describing a connection with an input/output circuit of the comparator circuit 30-1 in the embodiment. Blocks having substantially the same functions as those in the embodiment of FIG. 1 are designated by the same reference numerals and their description is omitted. The AD converting unit can convert a photoelectrically converted analog signal into a digital signal at a high speed. The comparator circuit 30-1 resets the N-signal of a pixel signal Va and the input signal of a ramp signal VRAMP by a pulse φc from the timing generating circuit 70.

Figure 5:
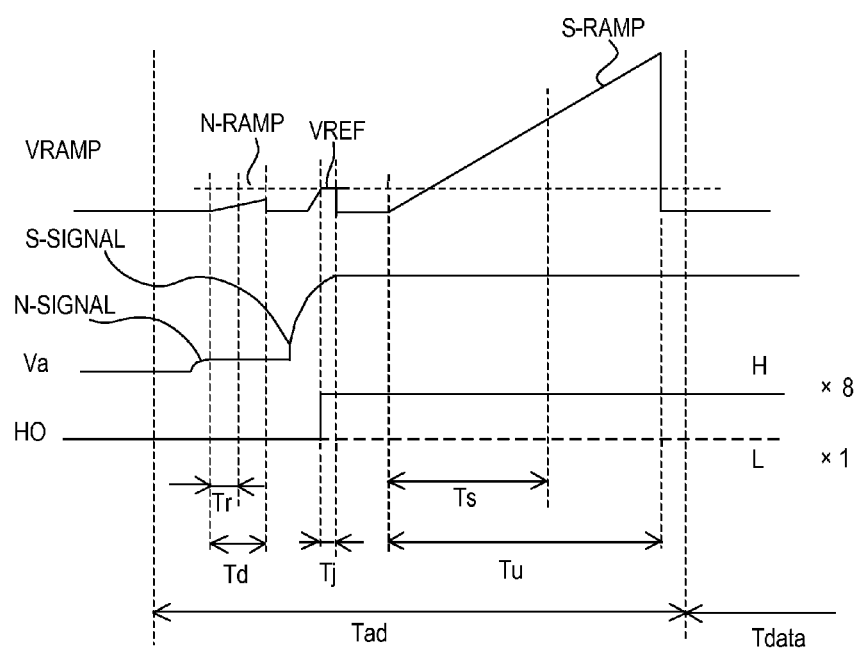
FIG. 5 is a timing chart of the AD converting unit in FIG. 4.

FIG. 5 is a timing chart for the AD converting unit in FIG. 4. The AD converting operation will be described hereinbelow with reference to FIGS. 4 and 5. In FIG. 5, a period Tad is a period during which the AD conversion of the N-signal and the S-signal of the pixel signal Va read out of the pixel 10-1 is performed. A period Tdata is a transfer period of the digital data. In the period Tad, a period Td is an AD converting period of the N-signal and a comparison signal for it is a ramp signal N-RAMP. A period Tj is a signal level discriminating period of the S-signal and a comparison signal for it is a threshold VREF. A period Tu is an AD converting period of the S-signal and a comparison signal for it is a ramp signal S-RAMP.

The amplifier circuit 20-1 has been set to a first gain (signal G1 in FIGS. 3A and 3B) of 1 time at the initial time of the operation illustrated in FIG. 5. As an output signal Va, the amplifier circuit 20-1 sequentially outputs the N-signal and the S-signal and they are guided to an input terminal of a comparator circuit 30-2 through a capacitor Ci. The signal VRAMP is input to another input terminal of the comparator circuit 30-2 through another capacitor Ci. The ramp signal generating circuit 25 is controlled by a pulse CNT1 of the timing generating circuit and generates the signal VRAMP. The signal VRAMP includes the ramp signals N-RAMP and S-RAMP and the threshold VREF. The amplifier circuit 20-1 is controlled by a signal CNT2 of the timing generating circuit 70.

The threshold VREF will now be described. Although an example in which the threshold VREF is generated by the ramp signal generating circuit 25 has been shown, it may be generated from another power source circuit. Since the threshold VREF can be generated by stopping a charging current on the way of a period at which the ramp signal is inclined and time-variable in the ramp signal generating circuit 25, there is such an advantage that the circuit construction can be simplified. The threshold VREF can be generated for a short period to the ramp signal S-RAMP. In order to further shorten such a period, it is sufficient to increase the charging current. It is necessary to set the threshold VREF so as to be larger than a maximum value which can be AD converted by the ramp signal N-RAMP. This is because by increasing the threshold VREF, it is intended to allow the comparison processing to be executed within a range of the signal level at which the small signal is certainly larger than the ramp signal N-RAMP. Specific numerical values will now be mentioned. In the example shown in FIGS. 3A and 3B, a case where the maximum value which can be AD converted by the ramp signal N-RAMP is set to 60 mV and the threshold VREF is set to about (60+V11) mV is considered.

For the AD converting period Td of the N-signal, the amplifier circuit 20-1 outputs the N-signal as an output signal Va. The ramp signal generating circuit 25 outputs the ramp signal N-RAMP as an output signal VRAMP. In order to raise the resolution of the N-signal, a ramp (inclination ratio) of the ramp signal N-RAMP is set to 1/8 of an inclination ratio of the ramp signal S-RAMP. The N-signal and the ramp signal N-RAMP are compared by the comparator circuit 30-1. After the elapse of the period Tr, a magnitude relation between those signals is reversed. The counter circuit 40-1 performs the downcounting for the period Tr. That is, when the inclination of the ramp signal N-RAMP is started, the counter circuit 40-1 starts the downcounting and, when the magnitude relation between those signals is reversed, the counter circuit 40-1 finishes the downcounting. A counted downcount value (first count value) is set into the counter circuit 40-1.

Subsequently, for the signal level discriminating period Tj, the amplifier circuit 20-1 outputs the S-signal as an output signal Va. The ramp signal generating circuit 25 outputs the threshold VREF as an output signal VRAMP. The comparator circuit 30-1 compares the S-signal with the threshold VREF. In this example, since the S-signal is larger than the threshold VREF, the comparator circuit 30-1 outputs a gain switching signal HO at the low level to the amplifier circuit 20-1. Thus, the gain of the amplifier circuit 20-1 is maintained at the first gain of 1 time and the amplifier circuit 20-1 outputs the S-signal (signal G1 in FIGS. 3A and 3B) amplified to 1 time as an output signal Va. If the S-signal is smaller than the threshold VREF, the comparator circuit 30-1 outputs the gain switching signal HO at the high level to the amplifier circuit 20-1. Thus, the gain of the amplifier circuit 20-1 is switched to a second gain of 8 times and the amplifier circuit 20-1 outputs the S-signal (signal G8 in FIGS. 3A and 3B) amplified to 8 times as an output signal Va. The second gain (high gain: 8 times) is larger than the first gain (low gain).

For the AD converting period Tu of the S-signal after the gain was set as mentioned above, the amplifier circuit 20-1 subsequently outputs the S-signal as an output signal Va. The ramp signal generating circuit 25 outputs the ramp signal S-RAMP as an output signal VRAMP. The S-signal and the ramp signal S-RAMP are compared by the comparator circuit 30-1. After the elapse of the period Ts, a magnitude relation between those signals is reversed. The counter circuit 40-1 which maintains the first count value set for the period Td performs the upcounting to the foregoing downcount value for the period Ts. That is, when the inclination of the ramp signal S-RAMP is started, the counter circuit 40-1 starts the upcounting and, when the magnitude relation between those signals is reversed, the counter circuit 40-1 finishes the upcounting. A counted upcount value (second count value) is set into the counter circuit 40-1. Thus, since this value indicates a difference between the first count value (first digital value) and the second count value (second digital value), it becomes a count value which is equal to a value obtained by subtracting the N-signal from the S-signal. A downcounting mode function and an upcounting mode function of the counter circuit 40-1 will be described hereinafter with reference to FIGS. 6A to 6C.

The low gain and the high gain which are set by the amplifier circuit 20-1 in FIG. 4 are assumed to be 1 time and 8 times, respectively. However, in an imaging system which will be described hereinafter in FIGS. 12A and 12B, in order to set a sensitivity suitable for an imaging environment, the low gain or the high gain of the amplifier circuit 20-1 is changed. Even when the gain of the amplifier circuit 20-1 is changed, if a gain ratio between a magnification of the low gain (first gain) and a magnification of the high gain (second gain) is made constant at the different imaging sensitivities, a correction quantity can be matched. If such a gain ratio is set to a value which is multiplier times as large as 2, the digital signal can be easily corrected. A gain ratio between the low gain (first gain) and the high gain (second gain) in the same frame of the image signal is constant. A gain ratio between the low gain (first gain) and the high gain (second gain) in the same horizontal pixel row of the image signal is constant. The sensitivity may be set by changing the inclination ratio of the ramp signal. Specifically speaking, by decreasing the inclination ratio of the ramp signal, the signal is AD converted at a high resolution and the high sensitivity can be eventually attained.

Figure 6A:
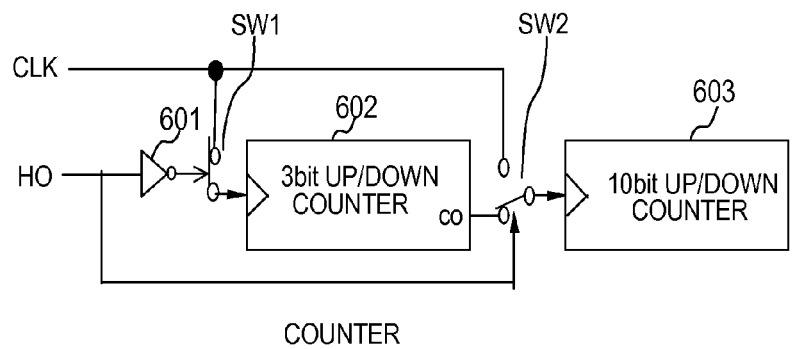
FIGS. 6A, 6B and 6C are explanatory diagrams of a bit shift of a counter.
Figure 6B:
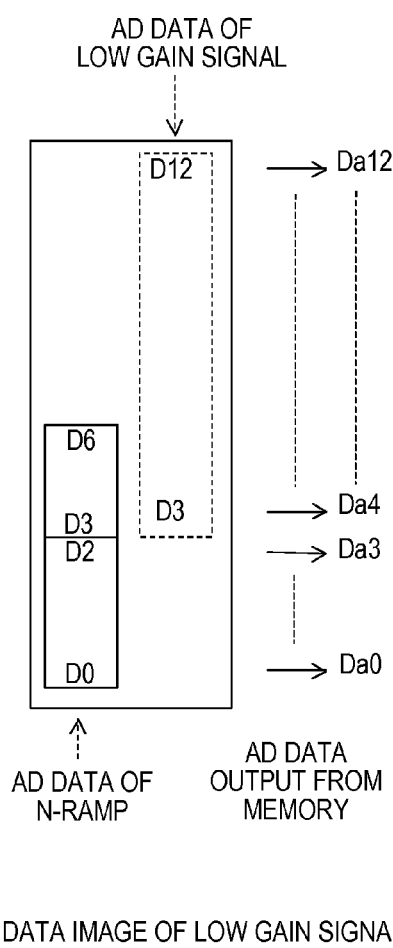
Figure 6C:
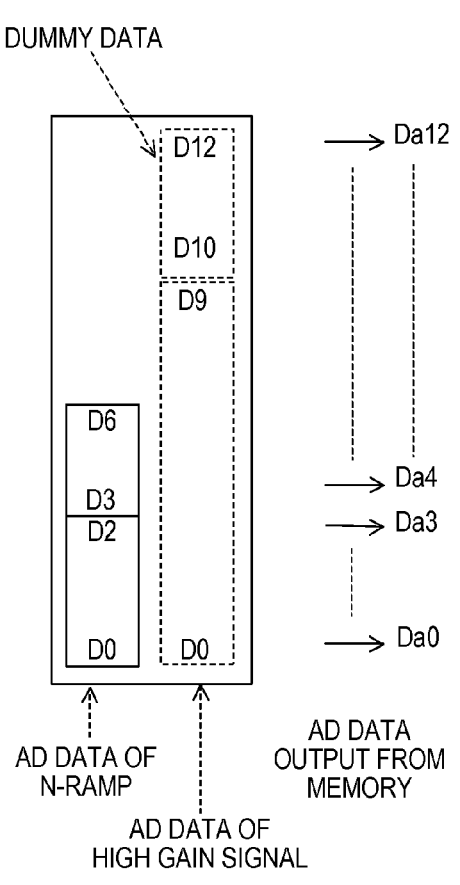

FIGS. 6A to 6C are diagrams illustrating a constructional example of the counter circuit (correcting unit) 40-1. The counter circuit 40-1 performs the counting until a relation between the outputs of the comparator circuit 30-1 in the comparison between the N-signal and the ramp signal N-RAMP and the comparison between the S-signal and the ramp signal S-RAMP is reversed. When the comparator circuit 30-1 performs the comparison of the N-signal, the counter circuit 40-1 executes the downcounting. On the other hand, when the comparator circuit 30-1 performs the comparison of the S-signal, the counter circuit 40-1 executes the upcounting. The memory unit 50 holds the count data in which a resolution ratio has been corrected.

FIG. 6A is the diagram illustrating the constructional example of the counter circuit 40-1. FIGS. 6B and 6C are diagrams for describing the count processing including the correction processing of the counter circuit 40-1. FIG. 6B is a diagram illustrating a case where the S-signal is larger than the threshold VREF after the N-signal and the ramp signal N-RAMP were compared and is a diagram showing the count data at the time when the S-signal and the ramp signal S-RAMP are compared. FIG. 6C is a diagram illustrating a case where the S-signal is smaller than the threshold VREF after the N-signal and the ramp signal N-RAMP were compared and is a diagram showing the count data at the time when the S-signal and the ramp signal S-RAMP are compared.

The counter circuit 40-1 has an inverter 601, a 3 bit up/down counter 602, a 10 bit up/down counter 603, and switches SW1 and SW2. The up/down counters shown in the constructional examples are asynchronous counters. A count clock signal CLK is input to the switches SW1 and SW2. The inverter 601 outputs a logic inversion signal of the gain switching signal HO. The switch SW1 is controlled by an output signal from the inverter 601. The switch SW2 is controlled by the gain switching signal HO. The count clock signal CLK is input to one of a clock terminal of the 3 bit up/down counter 602 and a clock terminal of the 10 bit up/down counter 603 in response to the gain switching signal HO.

FIG. 6B relates to the case where the S-signal is larger than the threshold VREF and the gain of the amplifier circuit 20-1 is set to 1 time. For the period Tr, the gain switching signal HO is set to the low level and the comparison processing of the N-signal is executed. Thus, the count clock signal CLK is input to the clock terminal of the 3 bit up/down counter 602 by the switch SW1. A carry-out output (carry-out) co of the 3 bit up/down counter 602 is output to the clock terminal of the 10 bit up/down counter 603 by the switch SW2. The 3 bit up/down counter 602 executes the downcounting synchronously with the count clock signal CLK and outputs data D0 to D2. The 10 bit up/down counter 603 executes the downcounting synchronously with the carry-out output co of the 3 bit up/down counter 602 and outputs data D3 to D6. A downcount value (first count value) of the N-signal becomes the data D0 to D6. Subsequently, for the period Tj, since the S-signal is larger than the threshold VREF, the gain switching signal HO is set to the low level, the gain of the amplifier circuit 20-1 is set to 1 time, and the amplifier circuit 20-1 outputs the low gain signal G1 of 1 time. Subsequently, for the period Ts, the gain switching signal HO is at the low level, and the count clock signal CLK is not input to the clock terminal of the 3 bit up/down counter 602 by the switch SW1. The count clock signal CLK is output to the clock terminal of the 10 bit up/down counter 603 by the switch SW2. The 10 bit up/down counter 603 upcounts up to the first count value synchronously with the count clock signal CLK and outputs an upcount value (second count value) to the memory unit 50. The memory unit 50 shifts the upcount value by 3 bits and holds 3 bit-shifted 10-bit data D3 to D12 as data Da3 to Da12. The memory unit 50 also hold the output 3 bit data D0 to D2 of the 3 bit up/down counter 602 as data Da0 to Da2. Eventually, in the 3 bit up/down counter 602 and the 10 bit up/down counter 603, the data in which the difference between the S-signal and the N-signal has been calculated becomes Da0 to Da12. The 13 bit data Da0 to Da12 correspond to the data D0 to D12 and are held in the memory unit 50. As mentioned above, the AD conversion data D3 to D12 of the S-signal of the low gain are shifted by 3 bits to the data D0 to D6 of the N-signal of the low gain and are subjected to the differential processing. Consequently, the 13 bit AD conversion data Da0 to Da12 of a high precision are obtained.

FIG. 6C relates to the case where the S-signal is smaller than the threshold VREF and the gain of the amplifier circuit 20-1 is set to 8 times. For the period Tr, in a manner similar to FIG. 6B, the downcounting of the N-signal is executed. A downcount value (first count value) becomes the data D0 to D6. Subsequently, for the period Tj, since the S-signal is smaller than the threshold VREF, the gain switching signal HO is set to the high level, the gain of the amplifier circuit 20-1 is set to 8 times, and the amplifier circuit 20-1 outputs the high gain signal G8 of 8 times. Subsequently, for the period Ts, since the gain switching signal HO is at the high level, the count clock signal CLK is input to the clock terminal of the 3 bit up/down counter 602 by the switch SW1. The carry-out output (carry-out) co of the 3 bit up/down counter 602 is output to the clock terminal of the 10 bit up/down counter 603 by the switch SW2. The 3 bit up/down counter 602 upcounts synchronously with the count clock signal CLK. The 10 bit up/down counter 603 upcounts synchronously with the carry-out output co of the 3 bit up/down counter 602 and outputs the 10 bit data D0 to D9 to the memory unit 50. Dummy data D10 to D12 are equal to "0". The 13 bit data Da0 to Da12 are held in the memory unit 50 in such a manner that the data D0 to D9 are held as data Da0 to Da9 and the data D10 to D12 are held as data Da10 to Da12, respectively. Eventually, in the 3 bit up/down counter 602 and the 10 bit up/down counter 603, the data in which the difference between the S-signal and the N-signal has been calculated becomes data Da0 to Da9. The dummy data D10 to D12 are added as data Da10 to Da12. The 13 bit data Da0 to Da12 are held in the memory circuit 50-1. Since the dummy data D10 to D12 are data of a small amplitude (high gain data), this means that the upper bits are equal to zero.

In the embodiment, as mentioned above, the N-signal eventually uses the count data which was comparison-processed at the high resolution of the low gain irrespective of the gain of the S-signal. Therefore, the digital data of a high precision in which the influence of the quantization noise of the low gain signal has been decreased can be obtained. By shifting the AD converted 10 bit count data by 3 bits, the digital data of 13 bits can be obtained. Further, since the differential processing of the S-signal and the N-signal and the gain correction are executed in the counter circuit 40-1, there is such an effect that the circuit is simplified. Although the counter circuit 40-1 having the counting functions of the downcounting mode and the upcounting mode has been used in the foregoing bit shift, the counter circuit 40-1 may be of the common counter system as mentioned above.

The comparator circuit 30-1 compares the N-signal and the ramp signal N-RAMP for the period Td. The counter circuit 40-1 counts the first count value for the period Tr until the magnitude relation between the N-signal and the ramp signal N-RAMP is reversed. After that, the comparator circuit 30-1 compares the S-signal with the threshold VREF for the period Tj. When the S-signal is larger than the threshold, the comparator circuit 30-1 sets the gain of the amplifier circuit 20-1 to the first gain (1 time). When the S-signal is smaller than the threshold, the comparator circuit 30-1 sets the gain of the amplifier circuit 20-1 to the second gain (8 times). After that, the comparator circuit 30-1 compares the S-signal with the ramp signal S-RAMP for the period Tu. The counter circuit 40-1 counts the second count value for the period Ts until the magnitude relation between the S-signal and the ramp signal S-RAMP is reversed. The correcting unit of the counter circuit 40-1 and the memory unit 50 corrects a difference of the resolutions of the first count value and the second count value corresponding to the difference of the gains of the N-signal and the S-signal. The memory unit (correcting unit) 50 outputs differential data Da0 to Da12 of the first count value and the second count value which were corrected.

Although the example in which the first count value is downcounted for the period Tr and the second count value is upcounted for the period Ts has been described above, it may be vice versa. By upcounting the first count value for the period Tr and downcounting the second count value for the period Ts, the counter circuit 40-1 may output the differential data Da0 to Da12 of the first count value and the second count value. That is, the counter circuit 40-1 downcounts or upcounts the first count value and counts the second count value in the direction opposite to the up/down direction of the first count value. Thus, the memory unit 50 can hold the differential data Da0 to Da12 of the first count value and the second count value which were corrected.

(Second Embodiment)

Figure 7:
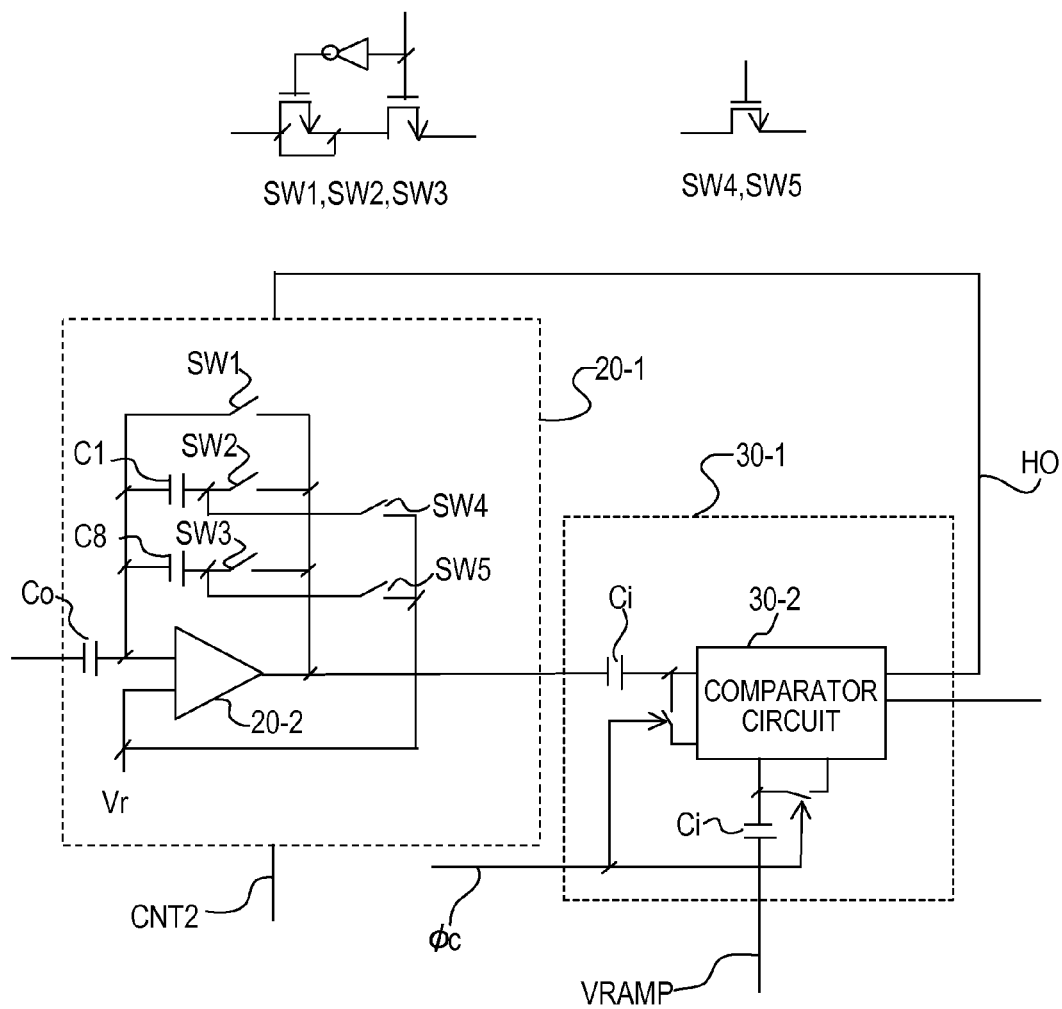
FIG. 7 is a block diagram of an amplifier circuit of the second embodiment of the invention.

FIG. 7 is a diagram illustrating a constructional example of the amplifier circuit 20-1 in the imaging device according to the second embodiment of the invention. The second embodiment will be described hereinbelow with respect to a point different from the first embodiment. According to the constructional example of the amplifier circuit 20-1, a circuit which can reduce an offset fluctuation at the time of the gain switching is used. The output signal Va of the amplifier circuit 20-1 is input to the comparator circuit 30-1. Even if the gains are switched after the signals Va and VRAM as input signals of the comparator circuit 30-1 were initial-reset by the pulse φc, a fluctuation in offset potential is small, so that a change in AD conversion data is small. If the gains are switched from the low gain to the high gain, since the AD conversion data of the high gain is gain-corrected, there is such an effect that a change amount of the offset potential is further decreased.

Subsequently, the operation of the amplifier circuit 20-1 will be described. The amplifier circuit 20-1 has an operational amplifier 20-2, clamps the N-signal serving as an input signal of the pixel 10-1 by a clamping capacitor Co, and outputs the signal Va amplified in accordance with the gain setting (for example, 1 time) to the comparator circuit 30-1. The operational amplifier 20-2 has an inverting input terminal, a non-inverting input terminal, and an output terminal. The clamping capacitor (second capacitor) Co is connected between the inverting input terminal and the pixel 10-1. A feedback circuit is constructed by: a switch SW1 for clamping the clamping capacitor Co to a threshold voltage Vr; and switches SW2 and SW3 for controlling connection of capacitors C1 and C8 for respectively amplifying input signals together with the clamping capacitor Co to/from input/output terminals. A serial connection circuit of the first capacitor C1 and the first switch SW2 and a serial connection circuit of the first capacitor C8 and the first switch SW3 are connected in parallel between the inverting input terminal and the output terminal of the operational amplifier 20-2. When the gain is switched, the feedback circuit perfectly transfers the electric charges in the capacitor to the capacitor in which the gain has been switched, thereby performing offset compensation. Switches SW4 and SW5 for gain compensation at the time of the gain switching are connected to the threshold voltage Vr. The second switch SW4 is connected between a mutual connection point of the first capacitor C1 and the first switch SW2 and the non-inverting input terminal of the operational amplifier 20-2. The second switch SW5 is connected between a mutual connection point of the first capacitor C8 and the first switch SW3 and the non-inverting input terminal of the operational amplifier 20-2. In the embodiment, capacitance values of the capacitors C1, C8, and Co are set so that the gains are equal to Co/C1=1 and Co/C8=8. In this case, a parasitic capacitor is omitted in the diagram for simplicity of description. The switches SW1 to SW5 have a construction of an equivalent circuit illustrated in the diagram.

Figure 8:
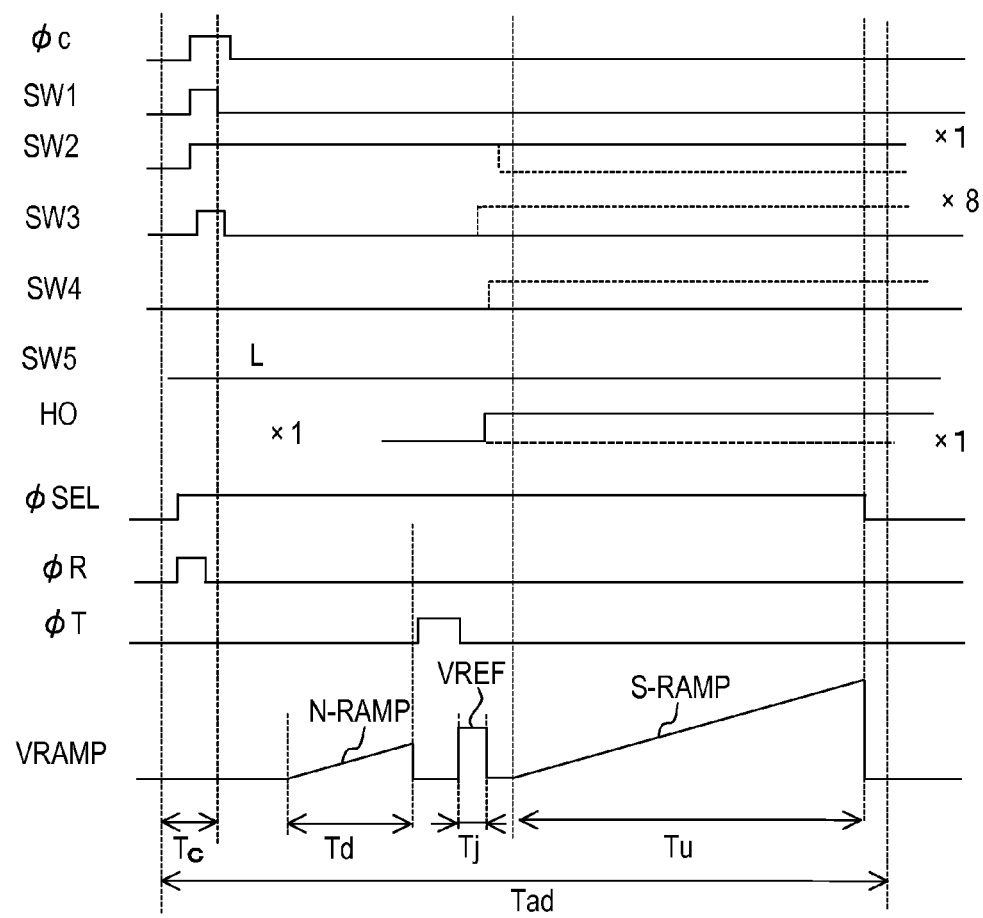
FIG. 8 is a timing chart of an imaging device.

A driving method of the amplifier circuit 20-1 in FIG. 7 will be described with reference to a timing chart of FIG. 8. In a manner similar to the timing chart of FIG. 5, the period Tad is an AD converting period of the N-signal and the S-signal, the period Td is an AD converting period of the N-signal, the period Tj is a discriminating period of the signal level of the S-signal, and the period Tu is an AD converting period of the S-signal. A period during which an initial setting of the amplifier circuit 20-1 and the comparator circuit 30-1 is made during the read-out of the N-signal from the pixel unit 10 before the AD converting operation is executed is a period Tc. For the period Tc, the amplifying transistor 104 is made operative by the high level of the pulses φSEL and φR of the pixel 10-1. At the same time, by turning on the switches SW1, SW2, and SW3, the amplifier circuit 20-1 is reset into an initial state. The comparator circuit 30-1 is reset into an initial state by the high level of the pulse φc. By setting the pulse φR to the low level and turning off the reset transistor 103, the floating diffusion portion FD enters the floating state. In order to set the amplifier circuit 20-1 into an initial gain (for example, gain of 1 time), the switch SW2 is held in the ON state and the switches SW1 and SW3 are turned off, so that the output signal Va of the amplifier circuit 20-1 is set to an offset voltage at the gain of 1 time obtained after the N-signal of the pixel was clamped.

Subsequently, by controlling the reset pulse φc of the comparator circuit 30-1 to the low level, the comparator circuit 30-1 is set to an electric potential in which the N-signal of the pixel signal has been clamped. Subsequently, for the period Td, the AD conversion of the N-signal is executed by using the ramp signal N-RAMP as mentioned above. When the period Td of the AD conversion is finished, the transfer transistor 102 is turned on by the high level of the pulse φT and the electric charges in the photodiode 101 are transferred to the floating diffusion portion FD. The amplifier circuit 20-1 outputs the N-signal amplified at the gain of 1 time as a signal Va to the comparator circuit 30-1. The transfer transistor 102 is turned off by the low level of the pulse φT. Subsequently, for the period Tj, the signal level of the S-signal is discriminated by using the threshold VREF as mentioned above. When the S-signal is smaller than the threshold voltage VREF, the gain switching signal HO is input as a high level signal to the amplifier circuit 20-1. Thus, the switch SW2 is turned off, the switches SW3 and SW4 are turned on, the gain of the amplifier circuit 20-1 is switched to 8 times, and the S-signal amplified to 8 times is output as a signal Va. When the S-signal is larger than the threshold voltage VREF, the gain switching signal HO is held at the low level, the switches SW1 to SW5 are not changed, and the gain of the amplifier circuit 20-1 is held to 1 time without being changed. By the above operation, the offset of the amplifier circuit 20-1 can be reduced. Subsequently, for the period Tu, the AD conversion of the S-signal is executed by using the ramp signal S-RAMP as mentioned above. Consequently, the AD conversion data in which the change in offset voltage of the amplifier circuit 20-1 has been reduced can be obtained.

Although the example in which the low gain signal is set to the initial gain has been described above, the high gain signal may be set to the initial gain and switched to the low gain by a gain switching signal. In the timing chart of FIG. 8, the inclination ratios of the ramp signals N-RAMP and S-RAMP are equal. In this case, since the resolutions of the N-signal and the S-signal are equal, the count processing at this time will be described hereinafter with reference to FIGS. 12A and 12B. Although the quantization noise of the low gain signal cannot be reduced, the high bit conversion can be accomplished.

Third Embodiment

Figure 9:
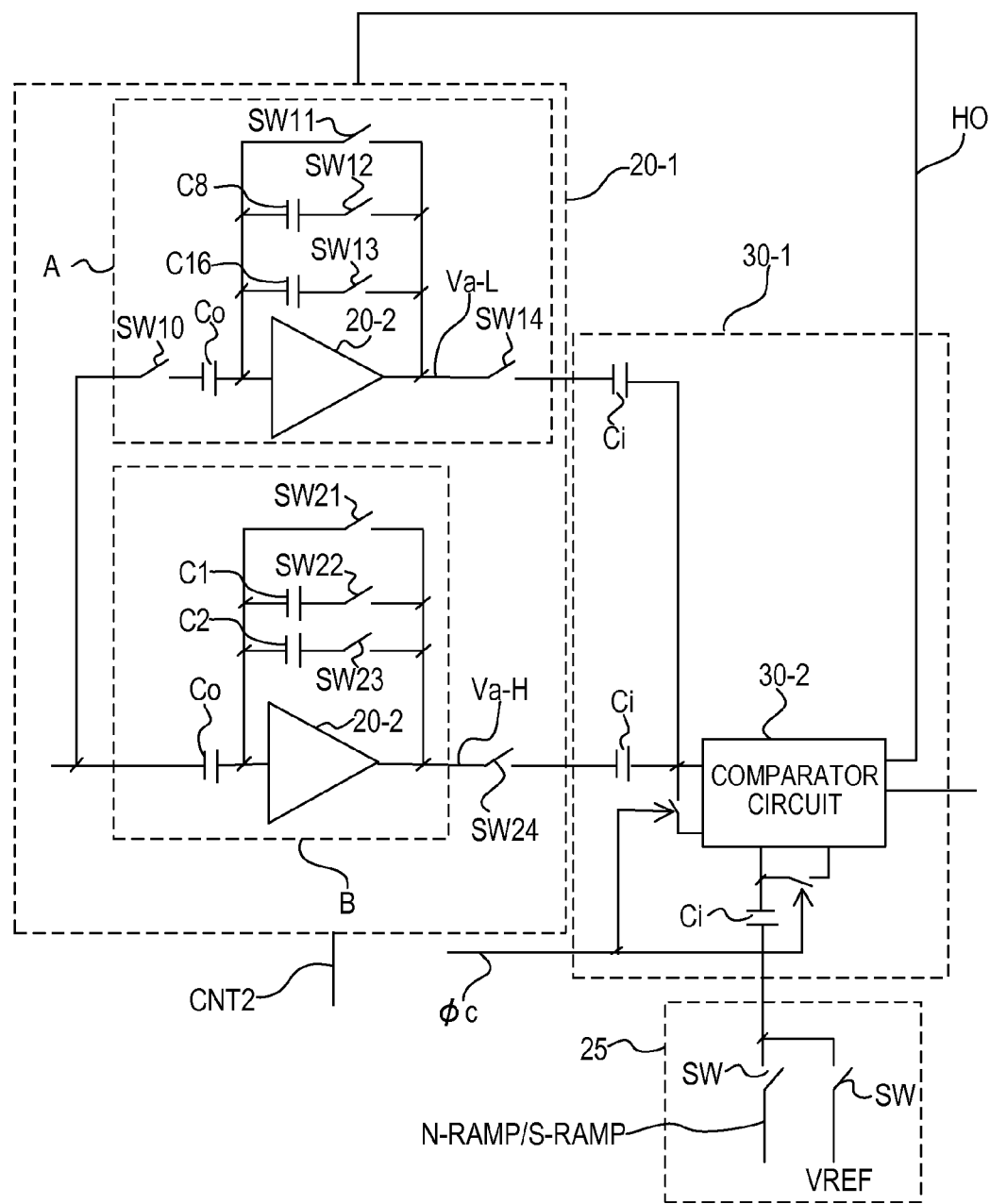
FIG. 9 is a block diagram of an AD converting unit of the third embodiment of the invention.

FIG. 9 is a diagram illustrating a constructional example of the amplifier circuit 20-1 and comparator circuits 30-1 in the imaging device according to the third embodiment of the invention. The third embodiment will be described hereinbelow with respect to a point different from the first and second embodiments. In the embodiment, the amplifier circuit 20-1 having amplifier circuits A and B of two systems is provided and the gain switching is performed. In the embodiment, a circuit construction of each of the amplifier circuits A and B of two systems is substantially the same as that of the amplifier circuit 20-1 in FIG. 7. The first amplifier circuit A has the first operational amplifier 20-2, capacitors Co, C8, and C16, and switches SW10 to SW14. The first operational amplifier 20-2 has an inverting input terminal, a non-inverting input terminal, and an output terminal. A serial connection circuit of the first capacitor C8 and the first switch SW12 is connected between the inverting input terminal and the output terminal of the first operational amplifier 20-2. A serial connection circuit of the second capacitor C16 and the second switch SW13 is connected between the inverting input terminal and the output terminal of the first operational amplifier 20-2. The third switch SW10 and the third capacitor Co are connected between the inverting input terminal of the first operational amplifier 20-2 and the pixel 10-1. The fourth switch SW11 is connected between the inverting input terminal and the output terminal of the first operational amplifier 20-2. The fifth switch SW14 is connected to the output terminal of the first operational amplifier 20-2.

The second amplifier circuit B has the second operational amplifier 20-2, capacitors Co, C1, and C2, and switches SW21 to SW24. The second operational amplifier 20-2 has an inverting input terminal, a non-inverting input terminal, and an output terminal. Each of a serial connection circuit of the fifth capacitor C1 and the fifth switch SW22 and a serial connection circuit of the sixth capacitor C2 and the sixth switch SW23 is connected between the inverting input terminal and the output terminal of the second operational amplifier 20-2. The seventh switch SW21 is connected between the inverting input terminal and the output terminal of the second operational amplifier 20-2. The fourth capacitor Co is connected between the inverting input terminal of the second operational amplifier 20-2 and the pixel 10-1. The eighth switch SW24 is connected to the output terminal of the second operational amplifier 20-2.

When the reset signal of the pixel is read out, the amplifier circuits A and B of the two systems and the comparator circuit 30-1 are simultaneously initial-reset and, thereafter, the gain setting is made. Although the gain setting differs in dependence on a concept of the sensitivity setting of the imaging system, in the circuit of FIG. 9 in the embodiment, the high gain is selected for the amplifier circuit A in consideration of the imaging sensitivity of the imaging apparatus and the amplifier circuit B is set to the low gain. Since the fundamental operation of the amplifier circuit 20-1 is substantially the same as that in FIG. 7, its description is omitted. The first amplifier circuit A corresponds to the amplifier circuit of the high gain, the second amplifier circuit B corresponds to the amplifier circuit of the low gain, and the gains are determined by the input capacitor Co and a feedback capacitor Cn. By using the capacitor C8, the first amplifier circuit A can be set to the gain of 8 times. By using the capacitor C16, the first amplifier circuit A can be set to the gain of 16 times. Similarly, by using the capacitor C1, the second amplifier circuit B can be set to the gain of 1 time and by using the capacitor C2, the second amplifier circuit B can be set to the gain of 2 times. Although the case of switching the two gains has been described as an example for simplicity of description, it is also possible to construct in such a manner that three or more gains can be switched. Although the operation for setting the gain of the first amplifier circuit A to 8 times and the operation for setting the gain of the second amplifier circuit B to 1 time will be described as an example, even if the gain setting is changed, the operations similar to those mentioned above are also executed. Generally, the gain of the image signal of one frame is determined in accordance with the sensitivity setting which is set by the imaging system. In the embodiment, since one of the gains is selected every pixel row in accordance with the signal level and the signal is AD converted, there is such an effect that the bit shift serving as a correction processing of the resolution from the foregoing AD conversion data can be easily performed by the same circuit or the same data processing. First, the gain of the first amplifier circuit A is set to the gain of 8 times and the S8 signal level is discriminated by the comparator circuit 30-1. When the S-signal is smaller than the threshold VREF, the signal of the high gain is subjected to the comparison processing. When the S-signal is larger than the threshold VREF, the signal of the low gain of the amplifier circuit B is selected and the comparison processing is executed. The gain ratio is set to 8 times. The reason why the signal of the high gain is compared with the threshold VREF and the signal level is discriminated will be described hereinbelow.

If the signal level is discriminated from the low gain signal when the gain ratio is equal to, for example, 16 times, now assuming that a saturated signal is equal to 1V, a one-to-a-gain discrimination level of the signal level is equal to about 62 mV. Since an N-signal amplitude of the comparator (variation of the reset signal) is set by presuming about 60 mV and an amplitude range of the N-signal is large, the signal level of the S-signal cannot be accurately discriminated. In the case of the signal of the high gain, since the discrimination of the signal level is made by the signal which is sufficiently larger than the N-signal, an influence of the N-signal can be decreased. For example, if the gain ratio is equal to 4 times, since the discrimination level of the signal level is equal to about 250 mV, an influence of the N-signal amplitude is small. Therefore, in the case where the gain ratio is small as mentioned above, the signal level may be discriminated by the low gain signal.

It is sufficient that the amplifier circuit 20-1 is a circuit which can output signals of two systems of the low gain and the high gain. An amplifier circuit of another system, for example, an amplifier circuit of a source grounded type may be used. The source grounded amplifier circuit has such an effect that a circuit area can be reduced. The low gain and the high gain may be simultaneously obtained or it is also possible to construct in such a manner that, first, the signal level is discriminated from one of the gain signals and, thereafter, the other gain is obtained.

Figure 10:
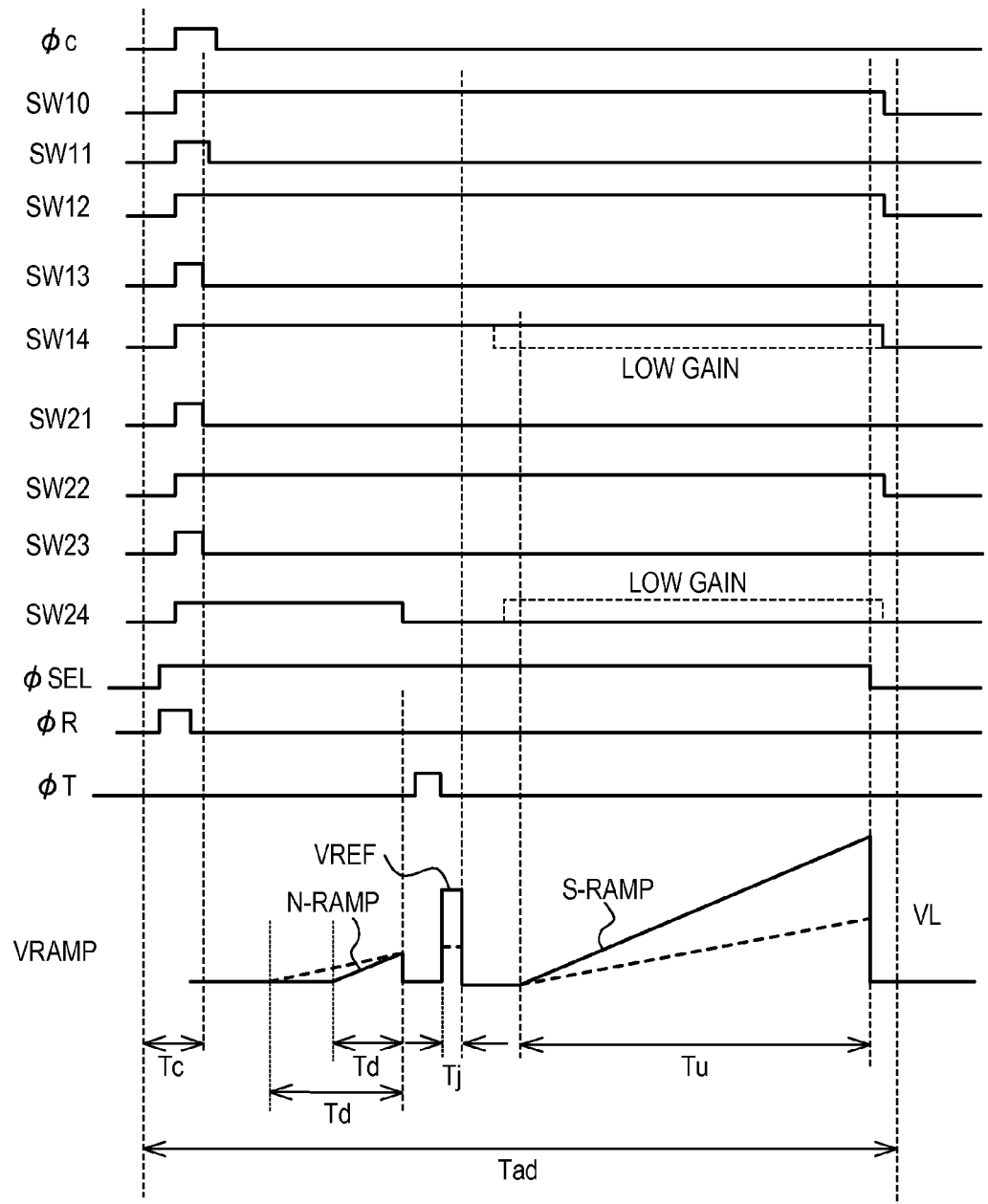
FIG. 10 is a timing chart of the AD converting unit in FIG. 9.

A driving method of simultaneously obtaining the signals of the low gain and the high gain and selecting the gain in the circuit of FIG. 9 will now be described with reference to a timing chart of FIG. 10. In a manner similar to the timing chart of FIG. 8, the period Tad is an AD converting period of the N-signal and the S-signal, the period Td is an AD converting period of the N-signal, the period Tj is a discriminating period of the signal level of the S-signal, and the period Tu is an AD converting period of the S-signal. A period during which an initial setting of the amplifier circuit 20-1 and the comparator circuit 30-1 is made during the read-out of the N-signal from the pixel unit 10 before the AD converting operation is executed is a period Tc. For the period Tc, the amplifying transistor 104 is made operative by the high level of the pulses φSEL and φR of the pixel 10-1. By turning on the switches SW10, SW14, and SW24 and by controlling the switches SW11, SW12, SW13, SW21, SW22, and SW23, the amplifier circuits A and B are reset into an initial state. The comparator circuit 30-1 is reset into an initial state by the high level of the pulse φc. By setting the pulse φR to the low level, the floating diffusion portion FD enters the floating state and the N-signal is input to the amplifier circuits A and B. In order to set the amplifier circuit A into the gain of 8 times, the switch SW12 is held in the ON state and the switches SW11 and SW13 are turned off, so that an output signal Va-L of the amplifier circuit A is set to an offset voltage at the gain of 8 times obtained after the N-signal was clamped. In a manner similar to the amplifier circuit A, in order to set the amplifier circuit B into the gain of 1 time, the switch SW22 is held in the ON state and the switches SW21 and SW23 are turned off, so that an output signal Va-H of the amplifier circuit B is set to an offset voltage at the gain of 1 time obtained after the N-signal was clamped. Subsequently, by controlling the reset pulse φc of the comparator circuit 30-1 to the low level, the input of the comparator circuit 30-2 is set to the voltage in which the N-signal has been clamped.

Subsequently, the switches SW10, SW14, and SW24 are held in the ON state and, for the period Td, the AD conversion of the N-signal is executed by using the ramp signal N-RAMP as mentioned above. When the AD converting period Td of the N-signal is finished, the switch SW24 is controlled to OFF and the amplifier circuit B is electrically disconnected from the comparator circuit 30-1. That is, only the output signal Va-L of the amplifier circuit A is input to the comparator circuit 30-2 through the capacitor Ci. Although the example in which the switch SW24 is turned off after the period Td was finished has been described above, the switch SW24 may be switched to OFF for an arbitrary period excluding the period Td within a range from the end of the period Tc to the start of the period Tj.

The transfer transistor 102 is turned on by the high level of the pulse φT and the electric charges in the photodiode 101 are transferred to the floating diffusion portion FD. The amplifier circuit A outputs the S-signal amplified at the gain of 8 times to the comparator circuit 30-1. The transfer transistor 102 is turned off by the low level of the pulse φT. For the period Tj, the signal level of the S-signal is discriminated by using the threshold VREF as mentioned above. When the S-signal is larger than the threshold voltage VREF, the gain switching signal HO is input as a high level signal to the amplifier circuit 20-1. Thus, the switch SW10 is controlled to OFF, the switch SW11 is controlled to ON, and the output signal Va-L of the amplifier circuit A becomes an offset signal of the amplifier circuit. That is, the input capacitor Ci of the amplifier circuit A and the comparator is returned to an initial reset potential. Subsequently, since the switch SW24 is controlled to ON, the signal of the gain of 1 time of the amplifier circuit B is input to the comparator. For the period Tu, the AD conversion of the S-signal is performed by using the ramp signal S-RAMP. Switching timing of the switches at the time when the S-signal of the amplifier circuit A is larger than the threshold VREF is as shown by a dotted line illustrated in the timing chart.

When the S-signal of the amplifier circuit A is smaller than the threshold VREF, for the period Tu, the AD conversion of the S-signal of the amplifier circuit A is performed by using the ramp signal S-RAMP. In the ramp signal VRAMP in FIG. 10, when inclination ratios of the ramp signals N-RAMP and S-RAMP to the time are decreased, since the AD conversion processing of the low amplitude signal is executed, it corresponds to the imaging of the high imaging sensitivity. At this time, it is also necessary to decrease the comparison threshold voltage VREF in proportion to the inclination ratios of the ramp signals (broken lines in the chart). In this case, since a variation of the N-signal does not change, an amplitude of the ramp signal N-RAMP is not changed. The ramp signal N-RAMP can be changed to a plurality of kinds of ramp signals in which the amplitudes are equal and the inclination ratios differ. As mentioned above, by decreasing the high gain of the amplifier circuit 20-1 and the inclination ratio of the ramp signal, the AD conversion processing of the high sensitivity can be performed.

As mentioned above, by controlling the switches SW14 and SW24, the output signals from the amplifier circuits A and B of two systems are selected and the signal amplified by the set gain is output to the comparator circuit 30-1. When the first gain (high gain) is set, the amplifier circuit 20-1 outputs only the output signal Va-L of the first amplifier circuit A to the comparator circuit 30-1. When the second gain (low gain) is set, the amplifier circuit 20-1 outputs the output signal Va-H of the second amplifier circuit B to the comparator circuit 30-1. In a state where the outputs of the amplifier circuits A and B of two systems are connected to the comparator circuit 30-1, the amplifier circuit 20-1 and the comparator circuit 30-1 are reset to an initial state. Or, the amplifier circuits A and B of two systems may be individually connected to the comparator circuit 30-1 and the amplifier circuit 20-1 and the comparator circuit 30-1 may be reset to an initial state. Consequently, there is such an advantage that even if the gain switching is performed, it is sufficient to execute the AD conversion of the N-signal serving as an initial reset signal once and the same AD conversion data of the N-signal can be used irrespective of the gain. By turning on the switches SW14 and SW24, a signal obtained by adding the output signal Va-L of the first amplifier circuit A and the output signal Va-H of the second amplifier circuit B can be output to the comparator circuit 30-2.

Since the signal level is small in a low illuminance environment, by raising the gain in the amplifier circuit, the signal level is increased or the inclination ratio of the ramp signal is decreased. On the contrary, since the photon shot noise is large in a high illuminance environment, an influence of the circuit series noise is very small. Therefore, in the embodiment, by correcting the data obtained by the low gain setting, a dynamic range of the signal is widened.

Figure 11:
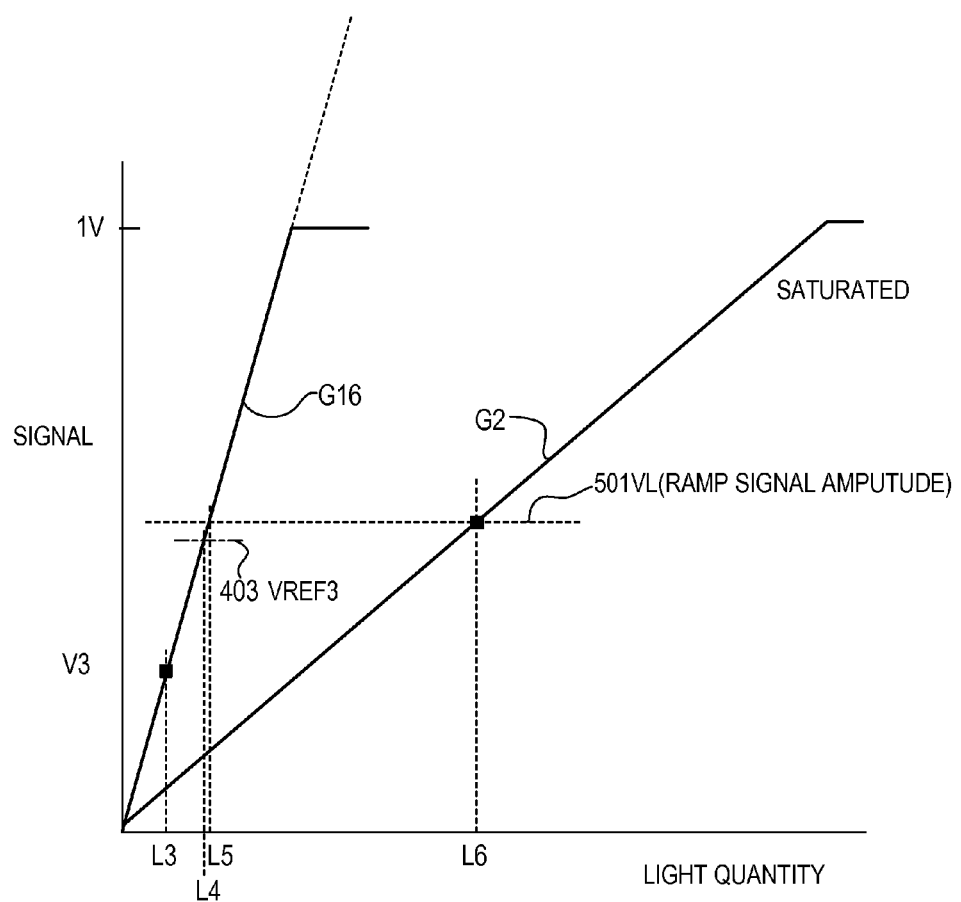
FIG. 11 is an explanatory diagram of a pixel signal.

A relation between the pixel signal and the ramp signals in the case of the high ISO sensitivity of the high gain in which the inclination ratio of the ramp signal is decreased will be described with reference to FIG. 11. For example, when the imaging sensitivity, which will be described in FIG. 13, is equal to the high ISO of 1600, a saturated signal of the amplifier circuit is set to 1V, the low gain is set to 2 times (G2), the high gain is set to 16 times (G16), and the inclination ratio of the ramp signal is set to 1/2. A ramp signal amplitude 501 of the S-signal is equal to VL and the signal smaller than such a level is AD converted. In the embodiment of FIG. 11, a light quantity to be AD converted is set to up to L6 for the signal of the characteristics G2 and is set to up to L4 for the signal of the characteristics G16.

The signal of the light quantity L3 will now be considered. Since a signal V3 of the characteristics G16 is equal to or less than a threshold voltage VREF3 shown by an alternate long and short dash line 403, it is AD converted and used. When the signal of the characteristics G16 is larger than the threshold voltage VREF3, the characteristics G2 of the low gain is used. The digital data is level shifted and used in such a manner that the digital data within a range from the light quantity L4 to the light quantity L6 corresponds to the data whose light quantity is equal to or larger than the light quantity L4 of the characteristics G16. Thus, the signal within the range from the light quantity L4 to the light quantity L6 can be used and the dynamic range is widened. Although the example in which the signal of the low gain is corrected has been described above, it is also possible to correct the signal of the high gain and increase the gain by an amount of 3 bits in a video signal processing unit in an imaging system at the post stage.

(Fourth Embodiment)

Figure 12A:
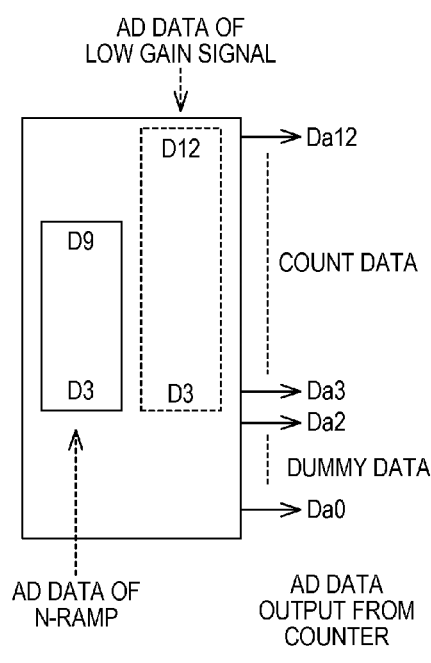
FIGS. 12A and 12B are explanatory diagrams of a bit shift of a counter.
Figure 12B:
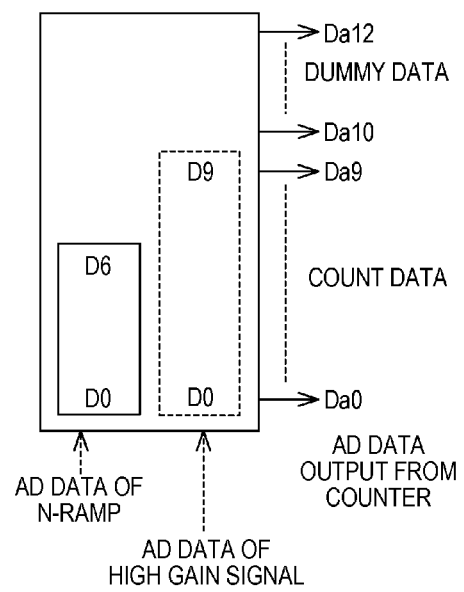

FIGS. 12A and 12B are diagrams for describing a count processing of a counter circuit (correcting unit) according to the fourth embodiment of the invention. In the embodiment of FIGS. 6A to 6C, at the time of the low gain, the N-signal is subjected to the count processing at the high resolution and the S-signal is subjected to the count processing at the low resolution. In the fourth embodiment, the N-signal and the S-signal are subjected to the count processing at the low resolution. The counter executes the S-N processing by using a 10 bit counter at the time of the count processing at the low gain and that at the high gain. The memory is a 13 bit memory. When data is held into the memory from the counter, the dummy data of 3 bits for the bit shift is added to the 10 bit data. Or, as another embodiment, it is also possible to construct in such a manner that the memory is a 11 bit memory, the added one bit is used as gain information, and the bit shift is performed when the data is transferred from the memory to a horizontal transfer line or is performed in the outside of the imaging apparatus. By constructing the counter of 10 bits instead of 13 bits in which the data for the bit shift has been added, there is such an effect that the circuit scale can be decreased.

FIG. 13 is a table illustrating a combination of the imaging sensitivity of the imaging system, the amplifier gain, and the inclination ratio of the ramp signal RAMP. In the imaging system in the related art, the signal gain is raised in accordance with the ISO sensitivity serving as an imaging sensitivity. For example, in ISO100, the gain is set to 1 time, in ISO200, the gain is set to 2 times, and in ISO400, the gain is set to 4 times. According to the method of uniformly raising the gain in accordance with the sensitivity of the imaging system in this manner, since the signal is liable to be saturated in the amplifier circuit, the range of the quantity of the light which can be used becomes narrow and the dynamic range deteriorates in accordance with an increase in ISO sensitivity.

In the embodiment, the low gain, the high gain, and the inclination ratio of the ramp signal is changed in accordance with the imaging sensitivity. The gain ratio between the low gain and the high gain is concerned with an expansion of the number of bits, an improvement of the S/N ratio, and an increase in dynamic range. Although the inclination ratio of the ramp signal restricts the amplitude of the signal to be AD converted, by decreasing the inclination ratio, a function similar to the high sensitivity is provided.

In the table illustrated in FIG. 13, until the imaging sensitivity of ISO400, the low gain is set to 1 time, the high gain is set to 8 times, and the inclination ratio of the ramp signal is set to 1 time. In the imaging sensitivity within a range from ISO800 to ISO3200, the low gain is set to 2 times and the high gain is set to 16 times. In the imaging sensitivity within a range from ISO6400 to ISO12800, the low gain is set to 4 times and the high gain is set to 16 times. The inclination ratio of the ramp signal is set to 1/2 in ISO1600, to 1/4 in the imaging sensitivity in ISO3200 and ISO6400, and to 1/8 in ISO12800. In the imaging sensitivity within a range from ISO100 to ISO3200, the bit rate is raised by an amount of 3 bits. In the imaging sensitivity of ISO6400 or more, the bit rate is raised by an amount of 2 bits.

In FIG. 13, the noise and dynamic range (DR) after the correction of the high gain signal are shown as an example. For instance, although the circuit series noise has been set to 1/8 in the imaging sensitivity of 100, this means that since the high gain signal is set to 1/8 after the AD conversion, the circuit series noise is equal to 1/8 as a calculated value. By decreasing the circuit series noise, the S/N ratio of the signal is improved. An improved amount of the S/N ratio owing to the decrease in circuit series noise has substantially the same meaning as the increase in dynamic range. In this instance, assuming that the case of the imaging sensitivity of 800 is set to 1, the dynamic range is widened by 8 times, and such a case is shown as a DR value 8. In the imaging sensitivity within a range from ISO200 to ISO800, the gain is higher than the gain setting according to the method in the related art. As a final ISO sensitivity, the increased amount of the gain larger than that in the method in the related art is adjusted. When describing ISO200, while the gain is equal to 2 times according to the sensitivity setting in the related art, it is equal to the high gain of 8 times in the embodiment. Therefore, in consideration of it, the gain of the high gain data is corrected to 1/4 and the gain of the high gain data is doubled, thereby adjusting the sensitivity. Eventually, the S/N ratio is improved. In the cases of ISO400 and ISO800, the gain correction is made on the basis of a similar concept. In ISO800, the DR value is set to 1. This means that although the circuit series noise is assumed to be 1/2 and the dynamic range is widened by 2 times by the gain correction of the high gain, since the low gain is doubled, the dynamic range is decreased to 1/2 by the saturation of the signal, so that the DR value is equal to 1. However, according to the method of raising the gain in the related art, since the DR value is equal to 1/8, the dynamic range is widened by 8 times according to the embodiment.

In ISO1600, since the high gain is equal to 16 times, it is the same gain as that in the sensitivity setting in the related art. As described in FIG. 11, the digital data of the low gain is increased by 8 times indicative of the gain ratio and the dynamic range of the signal is widened. However, since the inclination ratio of the ramp signal is equal to 1/2, the substantial enlargement of the dynamic range is equal to 4 times to the DR value of 1/16. In the case of the imaging sensitivity within a range from ISO3200 to ISO12800, a similar concept can be applied. In order to widen the dynamic range more than that in the embodiment, it is sufficient to increase the gain ratio. As mentioned above, in the embodiment, in the low sensitivity imaging, by correcting the gain of the digital data of the high gain, the circuit series noise is substantially decreased, so that the S/N ratio of the signal can be improved. In the high sensitivity imaging, by correcting the gain of the digital data of the low gain, the range of the light quantity where the signal can be used is widened, so that the dynamic range of the signal which is used can be widened.

When the imaging sensitivity is raised, since the object image becomes dark, the reception light quantity decreases and the photon shot noise dominantly determines the S/N ratio of the signal. Therefore, in the embodiment, after ISO3200, the high gain is not set for the increase in sensitivity like a related art. This is because the gain effect of the amplifier is small and whether or not the further high gain is set may be determined in dependence on how to construct the imaging system. If the high gain is set, it is necessary to increase the input capacitance of the amplifier, so that there is such a problem that a size of the imaging apparatus enlarges and current consumption increases. In the high sensitivity of ISO1600 or more, the high gain of the amplifier circuit 20-1 is not changed but the inclination ratio of the ramp signal is changed. In the embodiment, the high sensitivity is accomplished by decreasing the inclination ratio of the ramp signal.

Figures 14A, 14B:
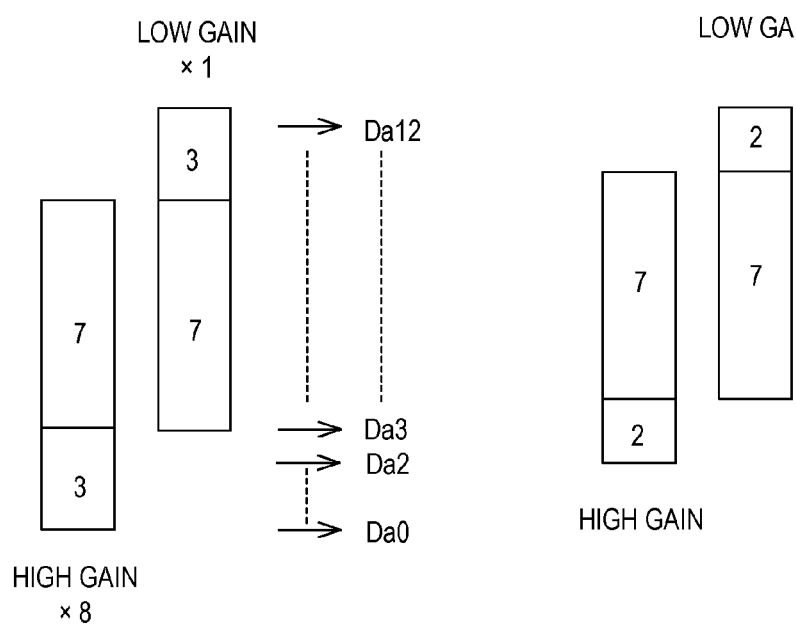
FIGS. 14A and 14B are explanatory diagrams of bits at the time of a high sensitivity imaging.

FIG. 14A is an explanatory diagram of a counter processing in which a ratio between the low gain and the high gain at the time of the low ISO sensitivity is equal to 8 times and 3 bits for the bit shift have been combined to the AD conversion data of 10 bits. FIG. 14B is an explanatory diagram of a counter processing in which a ratio between the low gain and the high gain at the time of the high ISO sensitivity is equal to 4 times and 2 bits for the bit shift have been combined to the AD conversion data of 9 bits. In the high ISO sensitivity, since the photon shot noise is very large, if the number of bits of the counter is reduced to 9 bits and the number of data is reduced without using 1 bit or 2 bits of the high resolution data, the high speed imaging can be performed. If the durations of the AD converting periods in the different imaging sensitivities are uniformed, a relation of the inclination ratios of the ramp signals shown in FIG. 13 is substantially equal to a relation of the amplitudes which the ramp signals can have.

(Fifth Embodiment)

Figure 15:
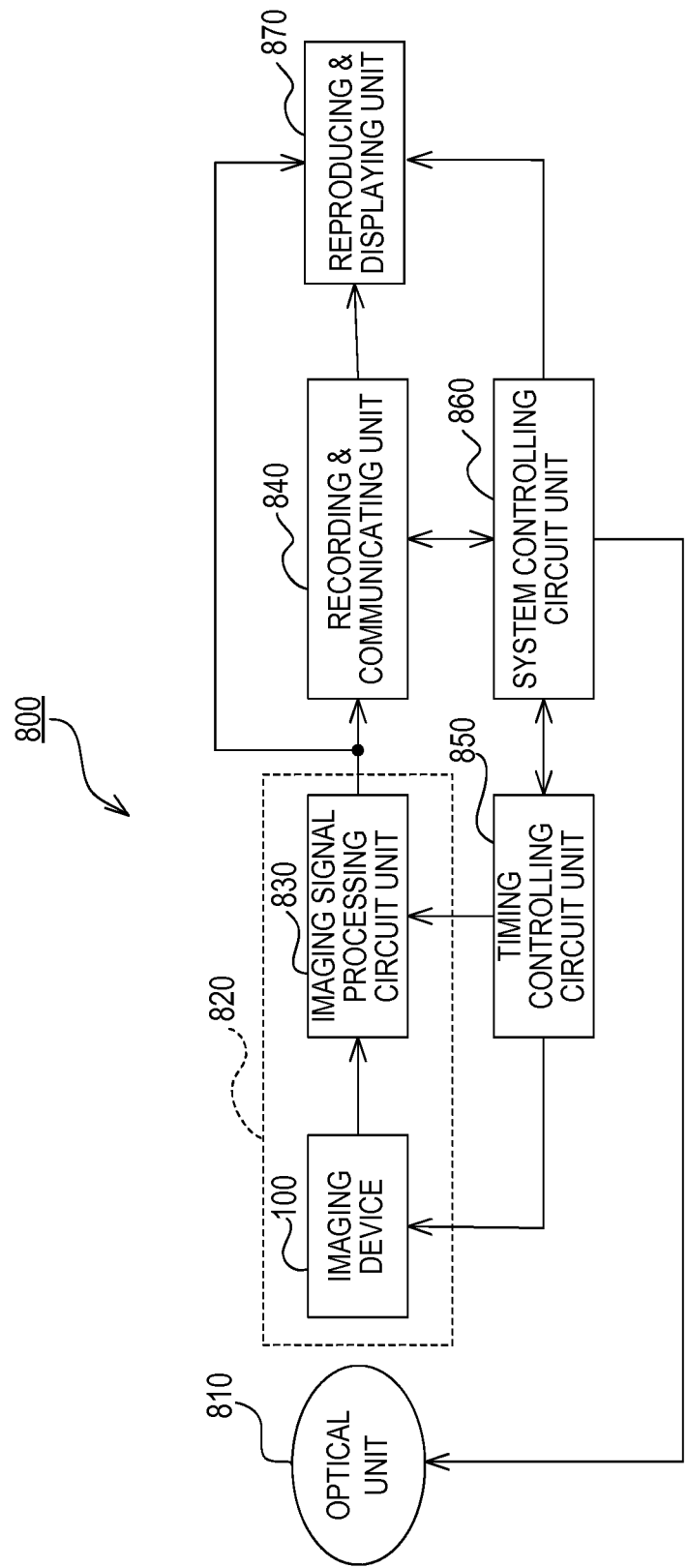
FIG. 15 is a constructional diagram of an imaging system.

FIG. 15 is a diagram illustrating a constructional example of an imaging system according to the fifth embodiment of the invention. An imaging system 800 includes, for example, an optical unit 810, the imaging device 100, an imaging signal processing circuit unit 830, a recording & communicating unit 840, a timing controlling circuit unit 850, a system controlling circuit unit 860, and a reproducing & displaying unit 870. An imaging apparatus 820 has the imaging device 100 and the imaging signal processing circuit unit 830. As an imaging device 100, the imaging device 100 described in each of the foregoing embodiments is used.

The optical unit 810 serving as an optical system such as a lens and the like allows light from an object to be formed (focused) into the pixel unit 10 (FIG. 1) in which a plurality of pixels are two-dimensionally arranged, thereby forming an object image. At timing based on a signal from the timing controlling circuit unit 850, the imaging device 100 outputs a signal corresponding to the light focused into the pixel unit 10. The signal output from the imaging device 100 is input to the imaging signal processing circuit unit 830 serving as an imaging signal processing unit. The imaging signal processing circuit unit 830 executes a signal processing to the input signal in accordance with a method decided by a program or the like. The signal obtained by the processing executed by the imaging signal processing circuit unit 830 is sent as image data to the recording & communicating unit 840. The recording & communicating unit 840 transmits a signal for forming an image to the reproducing & displaying unit 870, thereby allowing the reproducing & displaying unit 870 to reproduce and display a moving image or a still image. When the signal from the imaging signal processing circuit unit 830 is received, the recording & communicating unit 840 communicates with the system controlling circuit unit 860 and also executes the operation to record the signal for forming the image onto a recording medium (not shown).

The system controlling circuit unit 860 integratedly controls the operation of the imaging system and also controls the driving of the optical unit 810, timing controlling circuit unit 850, recording & communicating unit 840, and reproducing & displaying unit 870, respectively. The system controlling circuit unit 860 has a storage device (not shown) serving as a recording medium. A program or the like necessary to control the operation of the imaging system is recorded in the storage device. The system controlling circuit unit 860 supplies, for example, a signal for switching a driving mode in accordance with the operation of the user into the imaging system. As specific examples, there are a change of a row to be read out or a row to be reset, a change of an angle of view associated with an electron zoom, a deviation of an angle of view associated with an electron vibration isolation, and the like. The timing controlling circuit unit 850 controls timing for driving the imaging device 100 and the imaging signal processing circuit unit 830 on the basis of the control made by the system controlling circuit unit 860.

According to the first to fifth embodiments, the image noise can be reduced by executing a differential processing between the N-signal of a high resolution and a low gain and the S-signal of a proper gain. A circuit scale can be also reduced by executing the differential processing between the S-signal and the N-signal and a gain correction in the same counter circuit 40-1.

The foregoing embodiments have been shown and described merely with respect to the specific examples when embodying the invention and a technical scope of the invention should not be limitedly interpreted by them. That is, the invention can be embodied in various forms without departing from its technical idea or its principal feature. For example, although the ramp signal whose level is linearly time-variable has been described as a reference signal, a signal whose level changes in a stairway manner may be used. Although the construction in which the counter circuit is provided for each comparator circuit has been shown in each of the foregoing embodiments, it is also possible to use such a construction that a common counter circuit is provided for a plurality of comparator circuits and a memory corresponding to each comparison circuit is provided. It is also possible to construct in such a manner that each memory holds a count value of the common counter circuit by an output of the corresponding comparator circuit, thereby obtaining the foregoing first and second count values.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2012-091123, filed Apr. 12, 2012 and No. 2012-288391, filed Dec. 28, 2012, which are hereby incorporated by reference herein in their entirety.

What is claimed is:

1. An imaging apparatus comprising:
a pixel configured to generate a signal by photoelectric conversion;
an amplifier circuit configured to amplify the signal from the pixel at a set gain;
an AD converting unit; and
a correcting unit, wherein
the AD converting unit
compares an output signal from the amplifier circuit after reset of the pixel with a reference signal which changes with time, to output a first digital value,
sets the gain of the amplifier circuit at a first gain when the output signal from the amplifier circuit at a non-reset state of the pixel is larger than a threshold,
sets the gain of the amplifier circuit at a second gain larger than the first gain when the output signal from the amplifier circuit at the non-reset state of the pixel is smaller than the threshold, and
after setting the gain of the amplifier circuit at the first or second gain, compares the output signal from the amplifier circuit at the non-reset state of the pixel with the reference signal which changes with time, to output a second digital value, and
when a resolution of the first digital value is different from a resolution of the second digital value, the correcting unit corrects the difference of the resolutions.

2. The imaging apparatus according to claim 1, wherein the correcting unit corrects the difference of the resolutions by sifting the bits of the second digital value.

3. The imaging apparatus according to claim 1, wherein the correcting unit includes a counter, and
the counter down-counts or up-counts the first and second digital values, so that a direction of counting the first digital value is opposite to a direction of counting the second digital value.

4. The imaging apparatus according to claim 1, wherein the imaging apparatus includes a plurality of the pixels, a plurality of the amplifier circuits, a plurality of the AD converting units and a plurality of the correcting units,
a counter circuit is shared by the plurality of the correcting units, each of the plurality of the correcting units includes a memory configured to store, as the first and second digital value, count data outputted from the counter circuit.

5. The imaging apparatus according to claim 1, wherein the AD converting unit compares the output signal from the amplifier circuit after reset of the pixel with the reference signal, at a state such that the gain of the amplifier circuit is set at the first or second gain.

6. The imaging apparatus according to claim 1, wherein the AD converting unit compares the output signal from the amplifier circuit at the non-reset state of the pixel with the threshold, at a state such that the gain of the amplifier circuit is set at the first or second gain.

7. The imaging apparatus according to claim 1, wherein the AD converting unit compares the output signal from the amplifier circuit after the reset of the pixel with the reference signal,
the correcting unit includes a counter circuit, the counter circuit counts the first digital value until an inversion of a magnitude relationship between the output signal from the amplifier circuit after the reset of the pixel and the reference signal, and
after the inversion, the AD converting unit compares the output signal from the amplifier circuit at the non-reset state of the pixel with the reference signal, the counter circuit counts the second digital value until an inversion of a magnitude relationship between the output signal from the amplifier circuit at the non-reset state of the pixel and the reference signal.

8. The imaging apparatus according to claim 1, wherein the amplifier circuit includes:
an operational amplifier having an inverting input terminal, a non-inverting input terminal and an output terminal;
a plurality of serial connection circuits, each comprising a serial connection of a first capacitors and a first switch, the plurality of serial connection circuits are connected in parallel to each other between the inverting input terminal and the output terminal of the operational amplifier;
a plurality of second switches each connected between the non-inverting input terminal of the operational amplifier and a node between the first capacitor and the first switch of each of the plurality of the serial connection circuits; and
a second capacitor connected between the pixel and the inverting input terminal of the operational amplifier.

9. The imaging apparatus according to claim 1, wherein the amplifier circuit includes:
a first amplifier circuit capable of being set at the first gain; and
a second amplifier circuit capable of being set at the second gain.

10. The imaging apparatus according to claim 9, wherein the first amplifier circuit includes:
a first operational amplifier having an inverting input terminal, a non-inverting input terminal and an output terminal;
a plurality of first serial connection circuits, each comprising a serial connection of a first capacitors and a first switch, the plurality of first serial connection circuits are connected in parallel to each other between the inverting input terminal and the output terminal of the first operational amplifier; and
a second capacitor connected between the pixel and the inverting input terminal of the first operational amplifier;
the second amplifier circuit includes:
a second operational amplifier having an inverting input terminal, a non-inverting input terminal and an output terminal;
a plurality of second serial connection circuits, each comprising a serial connection of a third capacitors and a third switch, the plurality of second serial connection circuits are connected in parallel to each other between the inverting input terminal and the output terminal of the second operational amplifier; and
a fourth capacitor connected between the pixel and the inverting input terminal of the second operational amplifier.

11. The imaging apparatus according to claim 10, wherein the amplifier circuit outputs, to the AD converting unit, only an output from the first amplifier circuit when the first gain is set, and
the amplifier circuit outputs, to the AD converting unit, only an output from the second amplifier circuit when the second gain is set.

12. The imaging apparatus according to claim 9, wherein the amplifier circuit and the AD converting unit are reset to an initial state, under a condition that the plurality of outputs of the amplifier circuit output is connected to the AD converting unit.

13. The imaging apparatus according to claim 1, wherein the reference signal to be compared with the output signal from the amplifier circuit after the reset of the pixel can be selected from a plural kinds of reference signals having the same amplitude and having change rates with respect to time different from each other.

14. The imaging apparatus according to claim 1, wherein, according to a changing of an imaging sensitivity, a change rate with respect to time of the reference signal is changed while the gain of the amplifier circuit is not changed.

15. The imaging apparatus according to claim 1, wherein, according to a changing of an imaging sensitivity, change rate with respect to time of the reference signal is not changed while the gain of the amplifier circuit is changed.

16. The imaging apparatus according to claim 1, wherein a ratio of the first gain to the second gain is constant.

17. The imaging apparatus according to claim 1, wherein the ratio of the first gain to the second gain is constant within a same frame of an image signal.

18. The imaging apparatus according to claim 1, wherein the ratio of the first gain to the second gain is constant within a same pixel row of an image signal.

19. An imaging system comprising:
the imaging apparatus according to claim 1;
an optical unit configured to focus light onto the pixel; and
a video signal processing unit configured to process a signal outputted from the imaging apparatus.

* * * * *